(12) United States Patent
Jetté et al.

(10) Patent No.: US 7,151,789 B2
(45) Date of Patent: Dec. 19, 2006

(54) EXTERNAL-CAVITY LASERS

(75) Inventors: Stéphanie Marie-Julie Jetté, Kanata (CA); Pierre Simon Joseph Berini, Ottawa (CA)

(73) Assignee: Spectalis Corp, Nepean (CA)

( * ) Notice: Subject to any disclaimer, the term of this patent is extended or adjusted under 35 U.S.C. 154(b) by 244 days.

(21) Appl. No.: 10/739,334

(22) Filed: Dec. 19, 2003

(65) Prior Publication Data
US 2004/0131102 A1    Jul. 8, 2004

Related U.S. Application Data

(60) Provisional application No. 60/450,717, filed on Dec. 20, 2002.

(51) Int. Cl.
*H01S 3/08* (2006.01)
*G02B 6/00* (2006.01)

(52) U.S. Cl. ............................ 372/102; 372/92; 385/11

(58) Field of Classification Search .................. 372/92, 372/96, 98–102
See application file for complete search history.

(56) References Cited

U.S. PATENT DOCUMENTS

| | | | |
|---|---|---|---|
| 4,009,933 A | 3/1977 | Firester | |
| 4,384,760 A | 5/1983 | Alferness | |
| 4,390,236 A | 6/1983 | Alferness | |
| 4,479,224 A | 10/1984 | Rediker | |
| 4,533,207 A | 8/1985 | Alferness | |
| 4,776,656 A | 10/1988 | Sanford et al. | |
| 4,896,325 A | 1/1990 | Coldren | |
| 5,218,610 A | 6/1993 | Dixon | |
| 5,418,802 A * | 5/1995 | Chwalek | 372/20 |
| 5,499,256 A * | 3/1996 | Bischel et al. | 372/28 |
| 5,513,196 A * | 4/1996 | Bischel et al. | 372/22 |
| 5,559,816 A | 9/1996 | Basting et al. | |
| 5,568,504 A * | 10/1996 | Kock et al. | 372/96 |
| 5,644,584 A | 7/1997 | Nam et al. | |
| 5,734,667 A | 3/1998 | Esman et al. | |
| 6,021,141 A | 2/2000 | Nam et al. | |
| 6,181,728 B1 | 1/2001 | Cordingley et al. | |
| 6,205,159 B1 | 3/2001 | Sesko et al. | |
| 6,229,947 B1 | 5/2001 | Vawter et al. | |
| 6,243,407 B1 | 6/2001 | Mooradian | |
| 6,381,259 B1 | 4/2002 | Cordingley et al. | |
| 6,442,321 B1 | 8/2002 | Berini | |

(Continued)

FOREIGN PATENT DOCUMENTS

EP    1133035 A2    9/2001

(Continued)

OTHER PUBLICATIONS

Berini, P. "Plasmon-polariton waves guided by thin lossy metal films of finite width: Bound modes of symmetric structures". Physical Review B, vol. 61, No. 15, p. 10484, 2000.

(Continued)

*Primary Examiner*—Minsun Oh Harvey
*Assistant Examiner*—Phillip Nguyen
(74) *Attorney, Agent, or Firm*—Thomas Adams

(57) ABSTRACT

An external-cavity laser, suitable for producing a coherent and highly-polarized optical emission, particularly at communication wavelengths, is enabled by a novel wavelength selective element based on a waveguide technology that supports a long-range plasmons polariton mode. These external-cavity lasers leverage the inherent properties of the novel wavelength selective elements, which are materials agnostic, providing easier means for tunability, laser stability, and low cost of fabrication, high output power and a highly polarized output. Tunable versions are also disclosed.

46 Claims, 11 Drawing Sheets

U.S. PATENT DOCUMENTS

| | | | |
|---|---|---|---|
| 6,580,850 B1 * | 6/2003 | Kazarinov et al. | 385/28 |
| 6,614,960 B1 | 9/2003 | Berini | |
| 6,661,830 B1 * | 12/2003 | Reed et al. | 372/99 |
| 6,785,320 B1 * | 8/2004 | Amos et al. | 372/102 |
| 2002/0015433 A1 | 2/2002 | Zimmermann | |
| 2003/0223668 A1 | 12/2003 | Breukelaar et al. | |

FOREIGN PATENT DOCUMENTS

| | | |
|---|---|---|
| WO | WO 02/10815 A2 | 2/2002 |

OTHER PUBLICATIONS

Charbonneau, R., Berini, P., et al. "Long-Range Plasmon-Polariton Wave Propagation in Thin Metal Films of Finite-Width Excited Using an End-Fire Technique". Proceedings of S.

Berini, P. "Plasmon-polariton modes guided by a metal film of finite width bounded by different dielectrics", Optics Express, vol. 7, No. 10, p. 329, 2000.

Berini, P. "Plasmon-polariton modes guided by a metal film of finite width", Optics Letters, vol. 24, o. 15, p. 1011, 1999.

Charbonneau, R., Berini, P. "Experimental observation of plasmon-polariton waves supported by a thin metal film of finite width", Optics Letters, vol. 25, No. 11, p. 844, 2000.

Berini, P. "Plasmon-Polariton Waves Guided by Thin Lossy Metal Films of Finite Width: Bound Modes of Asymmetric Structures", Physical Review B, vol. 63, 125417, 2001.

Tredicucci, A. et al. "Single-mode surface-plasmons laser", Applied Physics Letters, vol. 76, No. 16, p. 2164, 2000.

Yeh, Pochi. "Optical Waves in Layered Media", Wiley, 1988.

Benson, H. et al. "Physique I Mécanique", Editions du Renouveau Pedagogique Inc., 1993.

* cited by examiner

EXTERNAL-CAVITY LASERS

CROSS-REFERENCE TO RELATED APPLICATIONS

This invention claims priority from U.S. Provisional patent application No. 60/450,717 file date Dec. 20, 2002 the contents of which are incorporated herein by reference.

FIELD OF THE INVENTION

The present invention relates to optical devices and especially to external-cavity lasers (ECLs) of the kind in which the operating wavelength is determined primarily by the resonant wavelength of a grating structure. The invention is applicable to ECLs which operate at a single wavelength or several wavelengths and to ECLs which are tunable to several different wavelengths.

BACKGROUND OF THE INVENTION

This specification refers to several published articles. For convenience, some of these articles are cited in full in a numbered list at the end of the description and cited by number in the specification itself. The contents of these articles, and the various patent documents also referred to hereafter, are incorporated herein by reference and the reader is directed to them for reference.

A Distributed Feedback laser (DFB) differs from an external cavity laser as the feedback mechanism is continuously provided along the gain medium via the monolithic integration of a Bragg structure and a waveguide in the gain medium. Some DFB lasers use surface plasmons as the guiding mechanism and/or a grating to provide the feedback. Tredicucci et al., in European Patent Application EP 1133035 A2 and in "Single-mode surface-plasmon laser", Applied Physics Letters, vol.76, no. 16, p.2164, 2000, disclose a DFB laser based on a quantum-cascade architecture that uses a metal grating to provide the feedback based on surface-plasmons excited at a single metal-semiconductor interface. The grating is included within the semiconductor laser structure to enhance mode selection, that is, create single mode lasing through Bragg reflection. The grating comprises deposited strips of titanium covered by a thick evaporated layer of gold to create a metal-grating structure with alternating stripes of pure Au and Ti/Au defining the refractive index perturbation.

A monolithic Distributed Bragg Reflector (DBR) laser holds similarities to external-cavity lasers. A monolithic DBR laser is a two mirror laser cavity with, for example, one mirror being a cleaved facet and the other a Bragg reflector waveguide containing a corrugated grating, as described by Coldren in "Monolithic Tunable Diode Laser", IEEE Journal on Selected Topics in Quantum Electronics, vol.6, no.6, p.988, 2000, and in U.S. Pat. No. 4,896,325. This grating is a narrowband wavelength selective mirror that selects a single longitudinal mode of operation. The highly reflective back facet usually has a reflectivity greater than 90%. A photo-diode can also be used to monitor the output power of the laser through this back facet. A wavelength tunable laser can be obtained from a DBR by injecting a current into the Bragg reflector which perturbs its refractive index and sweeps its center wavelength over a certain range.

External-cavity lasers and tunable external-cavity lasers are well known in the art. Typically, an external-cavity laser (ECL) is composed of an optical gain medium (a laser diode with an antireflection coating on one of two facets) and an external optical system which may include wavelength selective components, coupling optics, and other elements, to establish a lasing cavity thus providing feedback to the gain medium, An external-cavity laser provides many advantages over other integrated laser diode devices such as a Distributed Feedback laser (DFB) or a Distributed Bragg Reflector laser (DBR) or a Fabry-Perot laser. Advantages include extra control in the selection of the optical parameters of the cavity, and narrow line widths. ECLs are also easily pumped, reliable, provide dynamic external control of the selection and tunability of the emission wavelength and provide high efficiency. ECLs are also known to have greater spectral purity and wavelength stability.

Several external-cavity laser architectures can be found in the art. One example of an ECL architecture is the well-known Littrow-grating cavity laser, an example of which, disclosed by Zorabedian and Trutna in "Alignment Stabilized Grating Tuned External Cavity Semiconductor Laser", Optics Letters, vol.15, p.483, 1990, combines a gain chip, a collimating lens and a rotatable diffraction grating providing frequency selective feedback. U.S. Pat. No. 5,392,308 discloses a Littrow external cavity laser similar to the above where a tapered stripe gain chip is used.

Fleming and Mooradian in "Spectral Characteristics of External-Cavity Controlled Semiconductor Laser", IEEE Journal of Quantum Electronics, QE-17(1), p.44–59, January 1981, describe a grating-tuned double cavity laser. This ECL combines an optical amplifier with antireflection coatings on both facets to couple to two external cavities. One external cavity comprises a collimating lens and a diffraction grating for frequency selection and the other external cavity comprises a collimating lens and a partially reflective mirror for output coupling.

A fiber Bragg laser is another well known ECL. U.S. patent application Ser. No.2002/0015433 A1 by Zimmermann discloses a standard fiber Bragg laser comprising a gain chip with a highly reflecting facet that is coupled to a lensed fiber which contains a fiber Bragg grating. It is known that the lensed fiber can be replaced by a tapered fiber or a cleaved fiber coupled to a free space lens. Zimmermann also discloses a fiber Bragg external cavity laser which uses a distributed Bragg reflector (DBR) defined in the gain medium and a super-structure fiber Bragg grating (SSG) in the external cavity. A second disclosed laser uses a super-structure distributed Bragg reflector defined in the gain medium and a super-structure Bragg grating defined in the fibre as the reflective ends of the cavity, with the output being taken from the fibre grating.

Such previously-known external cavity lasers suffer from several limitations. These limitations may include, among others, high fabrication costs, large device sizes, weak polarization extinction ratios and elaborate wavelength tuning schemes.

It is often desirable for an external cavity laser to supply linearly-polarized light. Examples of external cavity lasers which include a polarizer and supply polarized light are discussed below.

Thus, in U.S. Pat. No. 5,734,667, Esman et al. disclose means for controlling the state of polarization in the resonant cavity of an external cavity doped fibre laser. The means disclosed comprise a number of optical elements, including reflectors, Faraday rotators and a polarizer, assembled using fibre sections or optical lenses.

In U.S. Pat. No. 4,479,224, Rediker discloses an external cavity laser comprising an array of semiconductor optical gain elements and reflectors. One of the reflectors may be a grating to enable wavelength selection. Means for ensuring that a known polarization state is emitted from the laser is also disclosed, such means implemented as a polarizer inserted into the optical path within the external cavity.

In U.S. Pat. Nos. 6,381,259 and 6,181,728, Cordingley et al. disclose an apparatus for modifying the state of polarization emitted by a laser cutting device. The apparatus ensures a linearly or elliptically polarized emission by placing in the optical output path of the laser a liquid crystal polarization modification element and a polarizer.

In U.S. Pat. No. 5,218,610, Dixon discloses an external cavity laser having a cavity defined by end mirrors with a polarizer and a voltage controlled variable liquid crystal waveplate in the light path between the end mirrors. The gain medium "sees" a reflectivity that is wavelength dependent and controllable by varying the voltage applied to the waveplate.

Disadvantages of such arrangements are increased losses and complicated assembly, since the polarizer and additional components need to be aligned along the optical path within the cavity, or along the optical path outside of the cavity.

In U.S. Pat. No. 4,009,933, Firester discloses a polarization selective mirror which reflects broadband TE and TM polarized light, but with only a 7% difference in the reflectivity of these states. According to Firester, such a device could be used as a reflector in the external cavity to help select a lasing polarization state. However, the difference in the reflectivity of this device is low and the reflector is not wavelength selective.

Bischel et. al disclose in U.S. Pat. Nos. 5,499,256 and 5,513,196 an external cavity laser that employs a polarization converter in the external cavity to achieve lasing in a single polarization. When discussing the prior art, Bischel et al. describe problems associated with a known external cavity laser by Heismann et al. which uses a waveguide that supports both TM and TE polarization modes and uses a thin film polarizer to limit the polarization to the TE mode prior to the output reflecting mirror. Bischel et al. point out that fabrication of Heismann et al.'s device is complicated because four transverse degrees of freedom must be controlled mechanically during the alignment of the laser chip and the polarizer. In addition, Bischel et al. point out that the thin film polarizer is a lossy element. Bischel et al. sought to overcome these alignment problems by means of a planar construction in which a TE-polarized diode laser is butt-coupled to a first waveguide which converts TE polarization to TM polarization (and vice-versa), the output of which is coupled to a second waveguide which supports only TM polarization. A limitation of such an ECL is that the TE-TM mode converter has an optical bandwidth (FWHM) about 1 nm; thus the line width of the emission is not expected to be very narrow.

Generally, all of these polarized-output external cavity lasers suffer from one or more of the following limitations: high fabrication costs, large device size, weak polarization extinction ratio, wide line width and elaborate wavelength tuning and stabilization schemes.

SUMMARY OF THE INVENTION

An object of the present invention is to provide an alternative to the above-mentioned external-cavity lasers and/or mitigate at least some of their limitations.

According to one aspect of the present invention there is provided a polarized external-cavity laser comprising:
a cavity formed by a first optical reflector means and a second optical reflector means aligned with said first optical reflector means at least one of the first and second reflector means being only partially reflective to permit light emission therethrough;
an optical gain medium disposed in the cavity and having an active waveguide formed therein;
at least one of the first and second optical reflector means being wavelength selective;
wherein the wavelength selective reflector means comprises a grating comprising a plurality of concatenated grating sections, physical characteristics of each section differing from physical characteristics of each adjacent section thereby defining a transition therebetween, at least some of the sections each comprising a waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave, said wave being partially reflected at the transition between said waveguide structure and the following said adjacent section, the arrangement being such that reflections at the different said transitions along said grating add constructively, and wherein the width (w) of the strip is considerably larger than the thickness (t) of the strip to such an extent that the strip only propagates light having one predetermined substantially linear state of polarization and the grating thus reflects light having said one predetermined substantially linear state of polarization, and wherein the optical gain medium and the wavelength selective reflector means are mutually interfaced such that the laser emits substantially linearly polarized light at the wavelength selected by the grating.

A waveguide structure capable of propagating light as a plasmon-polariton wave is disclosed in U.S. Pat. No. 6,442,321 issued Aug. 27, 2002 and commonly assigned with the present invention. Moreover, gratings employing such a waveguide structure are disclosed in copending U.S. patent application Ser. No. 09/915,363 and co-pending International patent application PCT/CA01/01077 (WO 0210815).

Where the active waveguide provides gain preferentially for light propagating therethrough in a predetermined plane extending through it in the propagation direction, the grating and active waveguide will be interfaced together so that the plane of the grating strip is substantially orthogonal to said predetermined plane.

Conversely, where the active waveguide provides gain preferentially in two mutually orthogonal planes, the grating and the active waveguide will be interfaced together so that the plane of the grating strip is substantially parallel to one of said mutually orthogonal planes.

The grating and the active waveguide may be interfaced directly together and each configured so that their modes substantially match, the interface means comprising anti-reflection means at their mutually-opposed facets, which may abut each other or be spaced apart.

Alternatively, the interface means may comprise a mode transition element disposed between the active waveguide and the wavelength selective reflector means. The mode transition element may comprises a second waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave, the thin strip of the second waveguide structure being coupled to the thin strip of the grating waveguide structure and dimensioned so as to provide the required mode matching.

The second strip may be tapered, having one end coupled optically directly or indirectly to the grating strip and the other end coupled to the active waveguide.

Alternatively, the interface means may comprise a mode transition element disposed in the optical gain medium between the active waveguide and the wavelength selective reflector means, the mode transition element being a waveguide similar in construction to the active waveguide.

Yet another alternative is interface means comprising lens means disposed in a space between the active waveguide and the grating.

Tuning means for varying the output wavelength of the laser may comprise a phase shifting element adjacent one end of the grating that is closest to the active waveguide and control means for controlling the phase shifting element to vary the phase shift introduced thereby, said control means also being used for controlling the grating waveguide structure to vary the reflection characteristics of the grating waveguide structure thereby to vary the wavelength of the light emitted by the laser.

The phase shifting element may comprise a waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave.

The portion of material may be thermo-optic and the control means be arranged to pass a current through the strip of the phase shifter and the strips of the grating waveguide structures and/or through at least one heater electrode extending alongside said strips, to heat the material surrounding the strips to vary an electromagnetic property. Alternatively, the portion of material may be electro-optic and the control means arranged to apply an electric field thereto, conveniently by means of one or more electrodes extending alongside the strips. Thus, the laser may have at least one electrode extending alongside part of the grating and spaced therefrom with a second portion of said material therebetween, the control means supplying a voltage between the electrode and the strips to vary an electromagnetic property of the second portion of material.

The second reflector means also may be wavelength-selective and, preferably, substantially identical to the first reflector means. Of course, where a tunable laser is concerned, the control means would be adapted to control both wavelength selective reflector means synchronously so that they both reflected the same wavelength.

In the context of this patent specification, the term "optical radiation" embraces electromagnetic waves having wavelengths in the infrared, visible and ultraviolet ranges.

The terms "finite" and "infinite" as used herein are used by persons skilled in this art to distinguish between waveguides having "finite" widths in which the actual width of the waveguide is significant to the performance of the waveguide and the physics governing its operation and so-called "infinite" waveguides where the width of the waveguide is so great that varying the width has no significant effect upon the performance, physics or operation of the waveguide.

The term "cavity" as used herein refers to an optical resonator comprised of end reflecting elements and the space and materials between the end reflecting elements in a laser.

The term "external" as used herein when referring to a cavity, includes the gain medium or light emitting element and is longer than the gain medium or light emitting element.

The term "mode-matching" as used herein means making the modes of the two waveguides as similar to each other as possible; specifically ensuring that transverse field intensity contours are well matched and polarization states are substantially aligned.

The term "super structure grating" as used herein refers to a grating constructed by the concatenation of a short grating section and a phase shifting section that is periodically repeated with a period $\Lambda_s$ that is long compared to the grating pitch. The grating structure can be a short uniform grating, or a linearly chirped grating for example. This long periodicity gives rise to periodic reflection peaks with a fixed wavelength separation since the grating phase is periodically modulated.

The term "interleaved grating" as used herein refers to a grating constructed by the period-wise combination of two gratings with slightly different periods.

The term "sampled grating" as used herein refers to a conventional grating where grating sections have been removed according to a sampling function.

The term "interleaved sampled grating" as used herein refers to the interleaving of several sampled gratings, or the sampling of an interleaved grating.

The waveguide structure can be fabricated from many materials, allowing the laser design to exploit specific materials properties, enabling designs for wavelength stability or tunability. Wavelength ranges of interest include wavelengths from 0.5 µm to the far infrared, and especially at communication wavelengths near 1.31 µm and 1.55 µm. Modal transformation or transition can also be achieved. The laser is also small in size. Numerous ECL architectures are possible using plasmon-polariton gratings in the external cavity.

The plasmon-polariton gratings used herein are not limited to any specific grating architecture. All plasmon-polariton grating designs (e.g. uniform, chirped, step-chirped, interleaved, sampled, sampled interleaved, apodized, superstructure, and higher order) disclosed in the cited references by the present inventors can be used in an external cavity laser architecture with appropriate design considerations as discussed hereinafter. In addition, as the plasmon-polariton gratings are printed, the pattern may take any form that adheres to the constraints of the fabrication method used.

Design requirements of the external-cavity laser entail consideration of the gain chip, optical coatings, wavelength selective element, and modal transition, as described hereinafter.

Other advantages and features of the present invention will be readily apparent from the following drawings, detailed description, examples of embodiments, and claims.

BRIEF DESCRIPTION OF THE DRAWING

Preferred embodiments of the invention will be described by way of example only with reference to the accompanying drawings in which:

FIG. 3A showing the luminescence spectrum of a typical gain medium; FIG. 3B showing the cavity resonant mode distribution of a typical cavity laser, and FIG. 3C showing the selection of a single cavity resonant mode for single mode lasing;

FIG. 12A showing an infrared image of the laser output; FIG. 12B showing the optical output power of the laser versus the applied current; and FIG. 12C showing the spectral output of the laser near threshold.

DETAILED DESCRIPTION OF PREFERRED EMBODIMENTS

Figure 1:
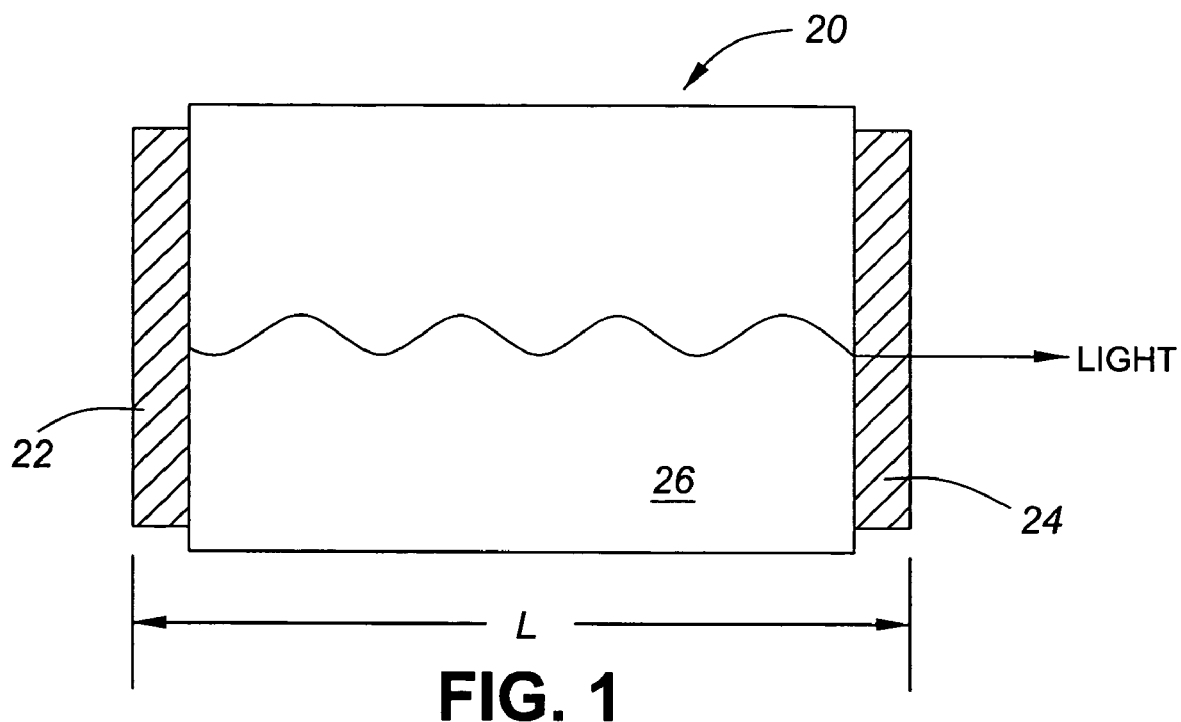
FIG. 1 shows a basic Fabry-Perot laser.
Figure 2:
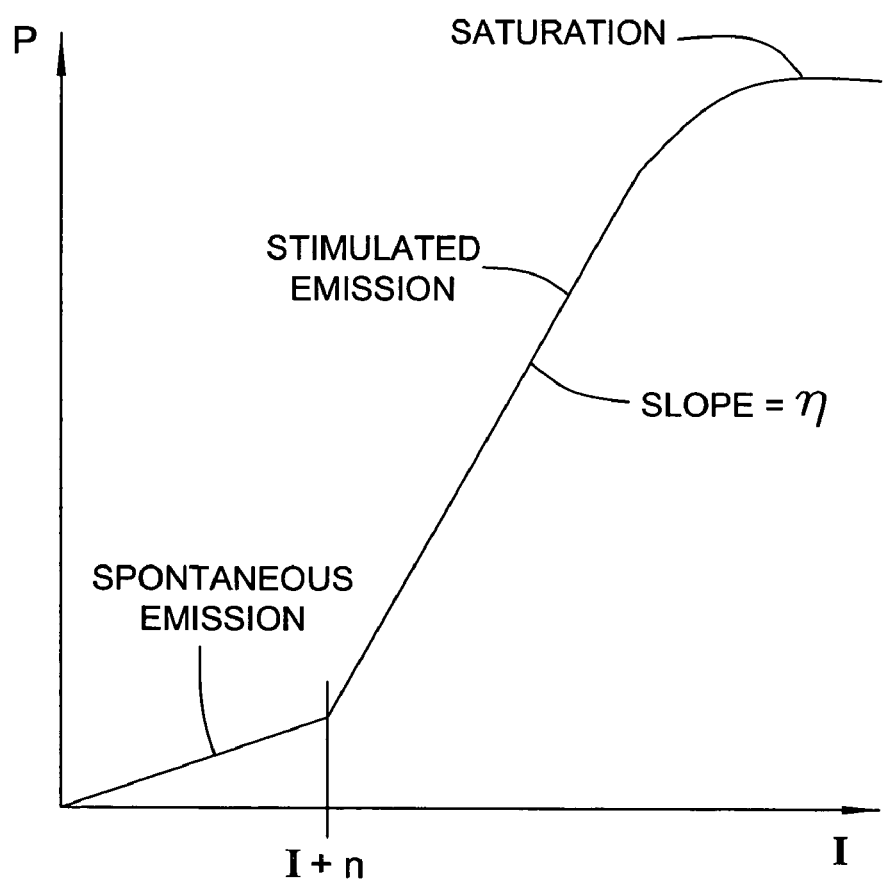
FIG. 2 shows the output power versus injection current for a typical diode laser.

In order to facilitate an understanding of ensuing description of the operation of preferred embodiments of the invention, a brief description of lasers and their operation will first be provided, with reference to FIGS. 1, 2 and 3.

Mode Spacing and Mode Selection Within the Cavity

FIG. 1 shows a basic lasing system 20 comprising a Fabry-Perot cavity of length L that is composed of a gain medium 26 with a high reflectivity mirror 22 at one end and a semi-transparent mirror 24 at the other. Lasing occurs when a population inversion of the carriers in the gain medium is achieved and the feedback produced by the two reflectors 22 and 24 that define the cavity is sufficiently strong. This system is a simplified model and is used for illustration purposes.

From the theory presented in reference [9], the maximum transmission of the cavity occurs at a free space wavelength $\lambda_0$ when the cavity length L is an exact integral multiple m of a half-wavelength:

$$m\lambda_0 = 2nL = 2L_{eff} \quad (1)$$

or $$m\frac{c_0}{f} = 2nL = 2L_{eff}, \quad (2)$$

where $L_{eff}$ is the effective optical path length of the system, n is the refractive index of the gain medium 26, m is an integer that specifies the mode number, $c_0$ is the velocity of the light in vacuum, and f is the optical frequency. It should be noted that the gain medium 26 of FIG. 1 usually contains a waveguide section of higher refractive index that supports a guided mode. The waveguide section can be realized as a ridge waveguide or a buried waveguide, for example. The waveguide supports a guided mode having an effective index of refraction $n_{geff}$ that is given by the normalized phase constant of the mode. If this waveguide section is present, the refractive index n of the gain medium 26 in equations (1) and (2) would be replaced by the effective refractive index $n_{geff}$ of the waveguide mode resonating in the cavity.

FIG. 2 shows the output power versus injection current for a typical diode laser, such as that shown in FIG. 1. Before the threshold current $I_{th}$ is reached, the carrier density within the gain medium is proportional to the injection current I and only spontaneous emission is obtained. For lasing to occur, the gain of the diode or gain medium at a resonant mode must exceed the total cavity losses through one round trip. The threshold gain $g_{th}$ required for lasing to occur is given by:

$$g_{th} = \frac{1}{C_p}\left[\bar{\alpha} + \frac{1}{2L}\ln\left(\frac{1}{R_{22}R_{24}}\right)\right] \quad (3)$$

where $\bar{\alpha}$ is the effective power absorption coefficient that takes into account all propagation loss mechanisms, $R_{22}$ and $R_{24}$ are the power reflection coefficients of the mirrors, and $C_P$ is the power confinement factor defined as the fraction of the mode power in the gain medium.

When the current exceeds the threshold, i.e., $I > I_{th}$, the output power of the external-cavity laser is dominated by stimulated emission and is related to the injection current as:

$$P_{out} = \eta(I - I_{th}) \quad (4)$$

where $\eta$ is the external differential quantum efficiency and $I_{th}$ is the threshold current ($I_{th} \propto g_{th}$) The external differential quantum efficiency can be found from the plot of the output power versus the applied injection current of FIG. 2 as the slope of the curve beyond threshold, $I > I_{th}$, but before the onset of saturation, $I < I_{sat}$, and is given by:

$$\eta = \frac{q}{hf}\frac{dP}{dI} \quad (5)$$

where h is Planck's constant, f is the frequency of the optical emission and q is the elementary charge. The external differential quanta efficiency can also be calculated theoretically using the relationship:

$$\eta = \frac{\eta_i(g_{th} - \bar{\alpha})}{g_{th}} \quad (6)$$

where $g_{th}$ is given by equation (3) and $\eta_i$ is the internal quantum efficiency of the laser defined as the number of photons per unit time generated in the active region of the source divided by the number of electron hole pair recombinations per unit time in the same region.

Figure 3A:
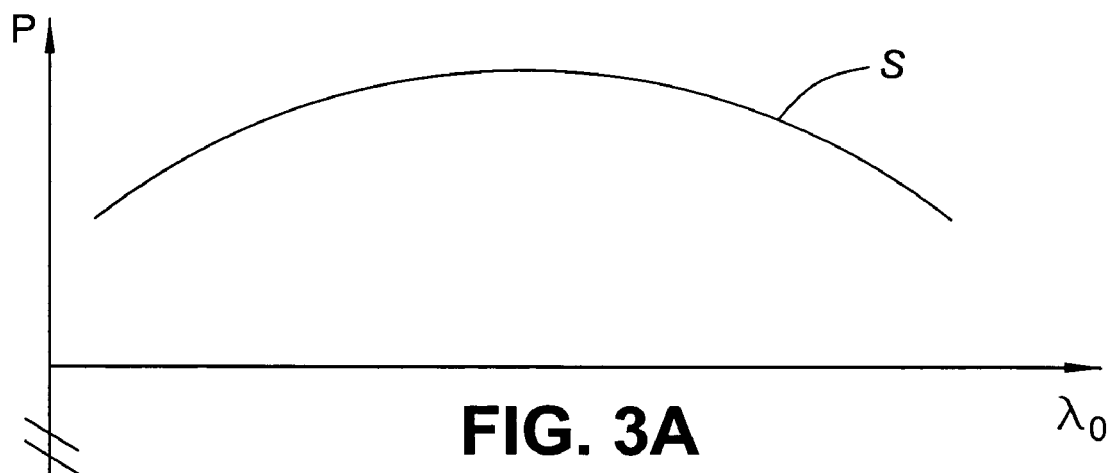
FIGS. 3A, 3B, and 3C show power spectra.
Figure 3B:
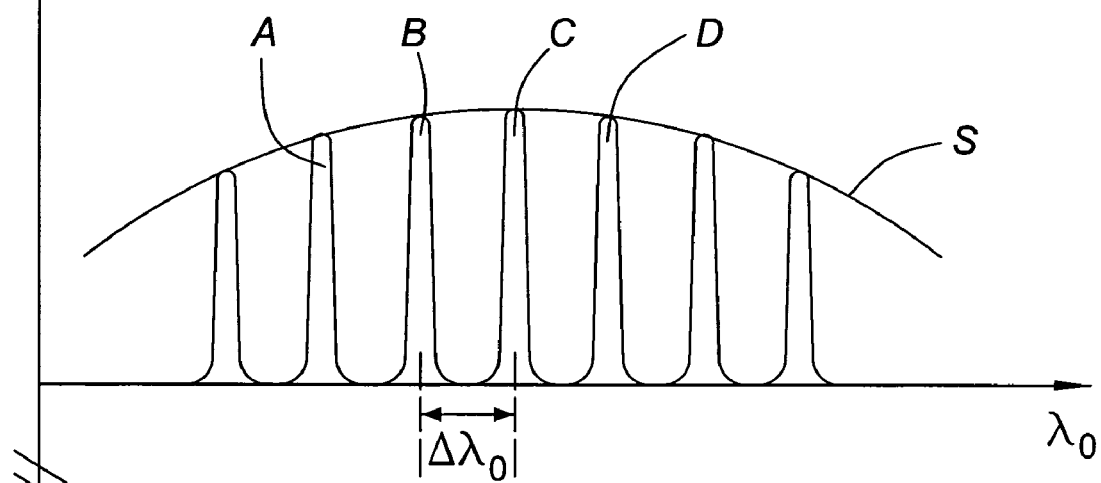

Referring to FIG. 1, a cavity 20 a given length L can support many resonant modes. The luminescence spectrum S of a typical gain medium is shown in FIG. 3A. This spectrum S overlaps with many cavity modes A, B, etc. as shown in FIG. 3B. The spacing of the modes depends on the length of the cavity L as well as the refractive index of the semiconductor used for the gain medium (or $n_{geff}$ for a waveguide mode) in the cavity. From equation (2), assuming normal incidence, two neighboring resonant frequencies are separated by a frequency spacing $\Delta f$:

$$\Delta f = \frac{c_0}{2nL} = \frac{c_0}{2L_{eff}} \quad (7)$$

Figure 3C:
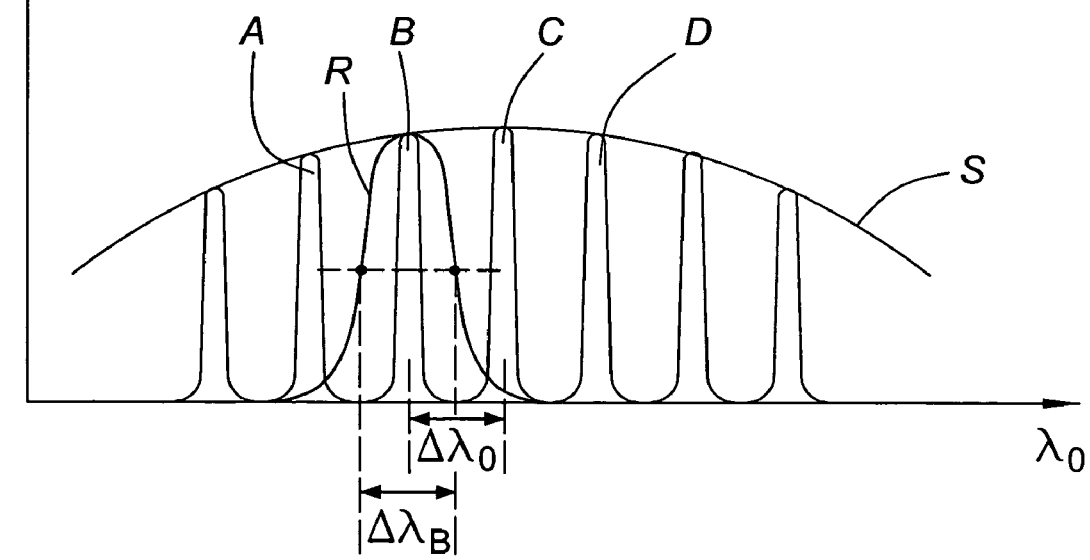

Equivalently, from equation (1), two neighboring wavelengths within the cavity will have a spacing of approximately:

$$\Delta\lambda_0 \approx \frac{\lambda_0^2}{2nL} = \frac{\lambda_0^2}{2L_{eff}} \quad (8)$$

Where the external cavity laser employs a grating as a reflector, such as in a distributed Bragg reflector (DBR) design in order to excite a single resonant mode and obtain single-mode lasing, only one (191B in FIG. 3C) of the resonant modes of the cavity must fall within the reflection bandwidth $\Delta\lambda_B$ of the grating, whose reflection spectrum is shown in FIG. 3C as curve R. The requirement for single mode lasing puts a constraint on the selection of the grating and on the physical length of the cavity, as the latter dictates the mode spacing. Contributors to the effective optical length of the cavity $L_{eff}=\Sigma nL$ include (i) the effective length of the gain medium $n_{geff}L_g$ where $n_{geff}$ is the effective refractive index of the mode supported by the waveguide in the gain medium; (ii) the effective length $n_iL_i$ of the intermediate material between the gain medium and the grating; and (iii) the effective length of the grating $n_{Beff}L_{Beff}$ where $n_{Beff}$ is the effective refractive index of the grating and $L_{Beff}$ is the effective length of the grating.

The number of resonant cavity modes M, for a given physical cavity length L, that will be present within a specified bandwidth for the grating, is given by:

$$M = 1 + \frac{\Delta\lambda_B}{\Delta\lambda_0} \quad (9)$$

where $\Delta\lambda_0$ is given by equation (8). The laser will be multi-moded when M exceeds 2. In order to excite only one resonant mode, the length of the cavity must be selected such that the spacing $\Delta\lambda_0$ between the cavity modes and the bandwidth of the gating satisfy:

$$\Delta\lambda_B < \Delta\lambda_0 \quad (10)$$

Thermal Considerations

A change in temperature may cause an expansion of the materials and a variation of the refractive indices (and gain) of the materials in the cavity. These thermal perturbations may perturb the effective cavity length of the laser and cause wavelength drift, mode-hoping and/or multi-mode lasing. From the coefficient of thermal expansion of a material, the variation in the length of each section due to changes in temperature can be found using the relation (see Ref [10]):

$$\delta L = CTE \cdot \Delta T \cdot L \quad (11)$$

The variation of the refractive index due to changes in temperature is given by:

$$\delta n = \frac{dn}{dT}\Delta T \quad (12)$$

The effective length of the cavity, $L_{eff}=\Sigma nL$, is found by adding the effective optical length of each section of the external cavity laser. The total cavity effective length following a temperature change of $\Delta T$ is defined as $L_{eff}=\Sigma(n+\delta n)(L+\delta L)$.

For an external-cavity laser, an expansion of any of the materials will increase the total length of the cavity, thus increasing the number of modes supported in the cavity since the separation between the individual modes is reduced. Using equation (8), the new modal spacing in the cavity resulting from a temperature change $\Delta T$ is given generally by.

$$\Delta\lambda_{0,T} = \frac{\lambda_0^2}{2}\left[\sum (n+\delta n)(L+\delta L)\right]^{-1} \quad (13)$$

where n is the effective refractive index of the guided mode when a waveguide is present.

Using equation (1), the change in the spectral location of the resonant wavelength $\lambda_0$ of the m-th mode of the cavity due to a thermal variation is given by:

$$\delta\lambda_0 = \frac{2}{m}\left[\sum nL - \sum (n+\delta n)(L+\delta L)\right] \quad (14)$$

A variation in temperature may also cause the center wavelength $\lambda_B$ of the grating to move in the spectrum. If the grating center wavelength shifts significantly, the external-cavity laser can hop to an adjacent mode in the cavity. An expansion of the length of the grating and/or a change in the effective refractive index of the grating will perturb the center wavelength approximately according to:

$$\delta\lambda_B = \frac{\delta L_{eff} \cdot \lambda_B}{L_{eff}} \quad (15)$$

where $L_{eff}$ and $\delta L_{eff}$ are the effective length and effective length variation of the grating and:

$$\delta\lambda_B = \frac{\delta n_{eff} \cdot \lambda_B}{n_{eff}}, \quad (16)$$

where $n_{eff}$ and $\delta n_{eff}$ are the effective refractive index and the effective refractive index variation respectively of the grating. The total variation in the grating center wavelength due to temperature is found by adding the contributions of equations (15) and (16).

The bandwidth of the grating can also vary due to the effects of temperature. Considering a uniform grating, the bandwidth as a function of temperature is given by:

$$\Delta\lambda_B(T) = 2\left[\frac{\pi\lambda_0}{4\sin^{-1}\left(\frac{\Delta n}{2n_{eff}(T)}\right)} \pm \sqrt{\left(\frac{\pi\lambda_0}{4\sin^{-1}\left(\frac{\Delta n}{2n_{eff}(T)}\right)}\right)^2 - \lambda_0^2}\right] \quad (17)$$

where $\Delta n$ is the modulation depth of the grating and $n_{eff}$ is the effective refractive index of the mode supported by the grating. If it is assumed that the modulation depth remains approximately constant with temperature, the only remaining contributor to a variation in the gating bandwidth is the temperature variation of the effective refractive index which depends only on the variation of the refractive index of the material. From equation (17), if $n_{eff}$ increases with temperature, the bandwidth decreases and vice-versa. As long as equation (10) holds, even with a variation in the bandwidth of the grating, the laser should remain single-moded.

The number of modes supported by a laser, as the temperature varies, is given by:

$$M_{\Delta T} = 1 + \frac{\Delta\lambda_{B\Delta T}}{\Delta\lambda_{0\Delta T}} \quad (18)$$

where $\Delta\lambda_{0\Delta T}$ is given in equation (13) and $\Delta\lambda_{B\Delta T}$ is given in equation (17) and is the bandwidth of the grating due to a change of $\Delta T$ in temperature.

Dielectric Discontinuities

The reflection at dielectric discontinuities within the cavity must be minimized to avoid the destabilization of the laser. The strength of these reflections depends on the materials and can be minimized with the use of antireflection coatings. The strength of a reflection at a boundary between two dielectric media is given by the power reflectance R defined as:

$$R = \left(\frac{n_2 - n_1}{n_2 + n_1}\right)^2 \quad (19)$$

where $n_1$ and $n_2$ are the refractive indices of the two materials. The simplest dielectric structure used to match material indices is an antireflection coating based on a single homogeneous dielectric layer. It is possible to use multilayer dielectric antireflection coatings using available materials to achieve zero reflectance at a desired wavelength and low reflectance over a broad spectral region. A single layer antireflection coating has a thickness $d_c$ set to a quarter-wavelength given by:

$$d_c = \frac{\lambda_0}{4n_c} \quad (20)$$

where $n_c$ is the refractive index of the antireflection coating. To achieve zero reflectance at a given wavelength $\lambda_0$, the refractive index $n_c$ of the antireflection coating is set to:

$$n_c = \sqrt{n_1 n_2} \quad (21)$$

where $n_1$ and $n_2$ are the refractive indices of the two materials to be matched. In the case where the calculated refractive index cannot be matched perfectly, a small reflection is present at this interface. A maximum reflection specification is thus defined to maintain the stability of the cavity. The reflectance at this interface with the added antireflection coating is now given by:

$$R = \left(\frac{n_1 n_2 - n_c^2}{n_1 n_2 + n_c^2}\right)^2 \quad (22)$$

The above equation can also be used to evaluate the reflectance of the antireflection coating over wavelength.

The Preferred Embodiments

External-cavity lasers that embody the present invention are illustrated in FIGS. 4 to 8 and will now be described with additional reference to FIGS. 9A to 12C. Corresponding elements in the different Figures have the same reference number.

Figure 4:
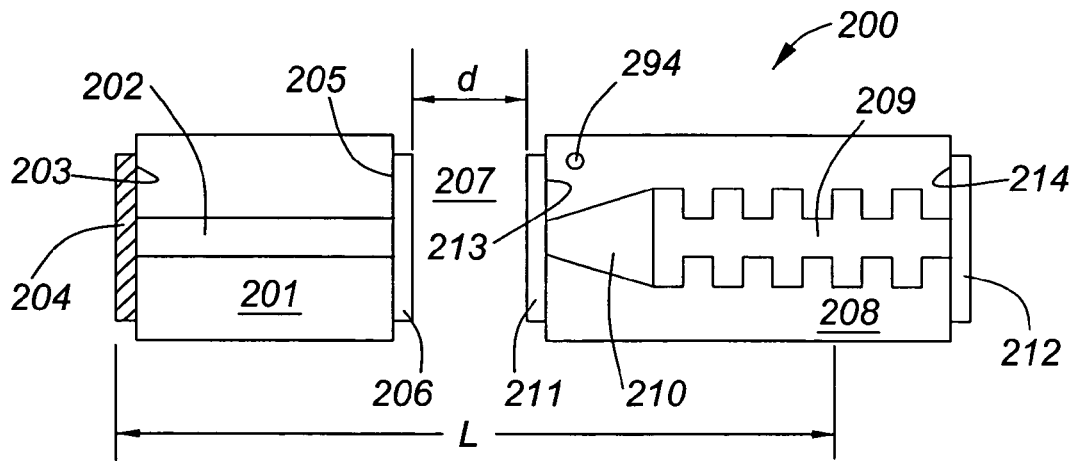
FIG. 4 is a top plan view illustrating an external-cavity laser that is a first embodiment of the present invention based on a plasmon-polariton grating with the mode matching included on the plasmon-polariton grating chip.

The first embodiment, shown in FIG. 4, is an external-cavity laser 200 comprising a gain medium in the form of a chip 201 having an active waveguide region 202 which can be defined as a ridge or buried waveguide, for example. The back facet 203 of the gain chip 201 is coated or terminated by a high reflectivity mirror 204 that is integral to the gain chip 201. The front facet 205 of chip 201 is coated by an optical grade antireflection coating 206. The requirements of the antireflection coating will be explained below. The gain chip 201 is brought within close proximity (i.e. butt-coupled) to a plasmon-polariton grating chip 208 through an intervening medium 207 of length d. The intervening medium 207 may be air or a material of refractive index n, for example a suitable epoxy resin.

The plasmon-polariton grating chip 208 contains a plasmon-polariton grating 209 and a mode converting element 210 which preferably, but not necessarily, takes the form of an adiabatic taper. The modal transition creates a better overlap between the fields of the plasmon-polariton grating 209 and the incident light associated with a mode of the gain medium 201. The design of this mode conversion element depends on the specification of the laser in particular of the waveguide 202. The mode conversion section 210 is designed to support the main plasmon-polariton mode, i.e. it too is a plasmon-polariton waveguide The plasmon-polariton grating 209 serves as the second reflective mirror. This creates a cavity, of length L, between the mirrors 204 and the plasmon-polariton grating 209. The length L is measured to a medial position along the grating 209. The effective optical path length of the cavity is given by:

$$L_{eff} = n_{202eff}L_{202} + n_{207}L_{207} + n_{210eff}L_{210} + n_{209eff}L_{209eff} \quad (23)$$

where n refers to the refractive index of the medium and $n_{202eff}$, $n_{210eff}$ and $n_{209eff}$ refer to the effective refractive index of the mode supported by the associated waveguide. The design and choice of architecture for the plasmon-polariton grating 209 depends on the material used for the chip 208, i.e. the material properties to be exploited, and the specifications of the external-cavity laser. The design, shape and properties of the plasmon-polariton grating will be treated in a subsequent section. The front facet 213 and back facet 214 of chip 208 are each coated with optical grade antireflection coatings 211 and 212, respectively, each similar to the coating 206 on facet 205.

The operation of the laser is as follows. A current is applied to the gain chip 201 by suitable means (not shown) to produce spontaneous light emission from the active waveguide region 202. This emission from the gain chip 201 travels towards the right and left and is reflected from reflector 204 and coupled to the plasmon-polariton grating chip 208 where the intermediate modal transition 210 couples it into the plasmon-polariton grating 209. The plasmon-polariton grating 209 reflects the light at a given wavelength back through the mode converter 210 to the gain chip 201, and is reflected once again by the highly reflective surface 204. The multiple reflections induce stimulated emission locked at the center wavelength of the plasmon-polariton grating 209. Light exits the laser 200 via facet 214 at the distal end of grating chip 208.

Figure 5:
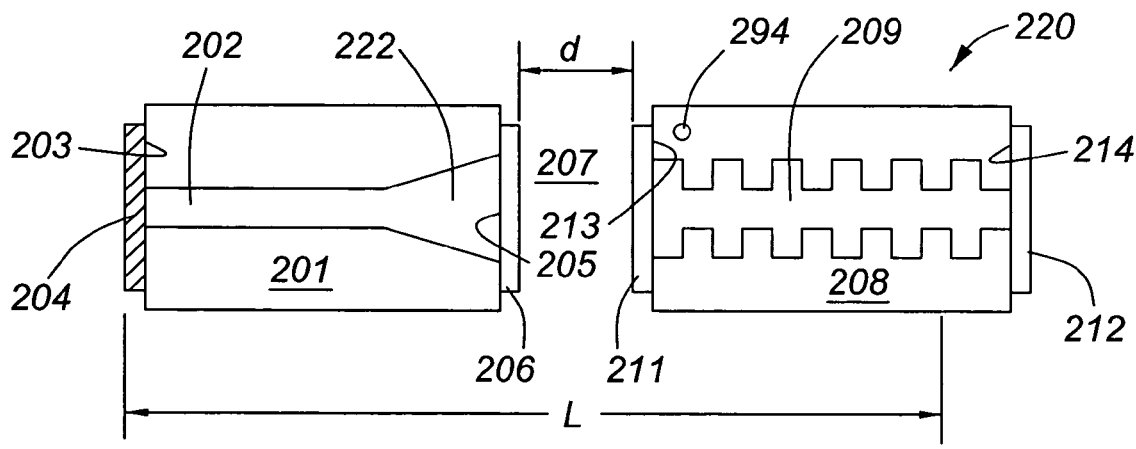
FIG. 5 is a top plan view illustrating a second embodiment in the form of an external-cavity laser based on plasmon-polariton gratings with the mode matching provided by the gain chip.

A second embodiment, shown in FIG. 5, comprises an external-cavity laser 220 identical to the laser 200 presented in FIG. 4 except that the mode conversion portion is transferred from the plasmon-polariton grating chip 208 to the gain chip 201. Thus, in the laser 220, shown in FIG. 5, the mode matching is provided as part of the waveguide 202. The mode conversion means, or expansion means in this case, is a tapered strip portion 222 for example. The mode matching can also be provided by a passive taper positioned away from the gain region, say in a plane longitudinally parallel to, and spaced from, waveguide 202 with broadside coupling provided therebetween.

The transition piece 222 could also be implemented as a small rib waveguide structure disposed on top of a larger one such that the mode transitions adiabatically between them, as disclosed by Vawter et al. in U.S. Pat. No. 6,229,947.

The alignment or butt-coupling of chips 201 and 208 is simplified in this laser 220 as the mode size diameter to be coupled through intervening medium 207 can be greater than in architecture 200. The larger mode spot size relaxes the alignment tolerances of the two chips 201 and 208. The effective optical path length of the cavity for this architecture is given by:

$$L_{eff} = n_{202eff}L_{202} + n_{222eff}L_{222} + n_{207}L_{207} + n_{209eff}L_{209eff} \quad (24)$$

where n refers to the refractive index of the medium and $n_{202eff}$, $n_{222eff}$ and $n_{209eff}$ refer to the effective refractive index of the mode supported by the associated waveguide. The operation of this laser 220 is the same as that of laser 200 as described above.

Figure 6:
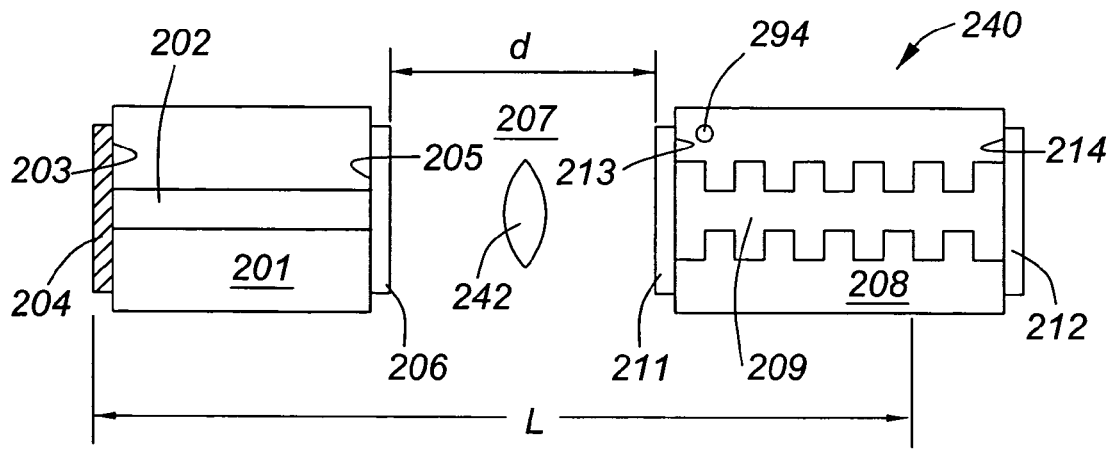
FIG. 6 is a top plan view illustrating a third embodiment in the form of an external-cavity laser architecture based on plasmon-polariton gratings with mode matching provided by intermediate optics between the gain and plasmon-polariton grating chips.

A third embodiment, shown in FIG. 6, is an external-cavity laser architecture 240 which is similar to the first and second embodiments but differs because neither the gain chip 201 nor the plasmon-polariton grating chip 208 includes a mode conversion element. Instead, the mode matching between the chips 201 and 208 is provided by a small intermediate lens 242 placed between both chips in intervening medium 207 which, in this case, is air. The lens 242 can take many forms but should be free from birefringence in order to maintain a constant state of polarization. It should also be free from chromatic aberration to allow for tuning of is the laser over wide wavelength ranges.

Although only one lens 242 is shown in FIG. 6, it should be appreciated that an arrangement of several lenses could be used.

The effective optical path length of the cavity for the laser 240 is given by:

$$L_{eff} = n_{202eff}L_{202} + n_{207}L_{207} + n_{242}L_{242} + n_{209eff}L_{209eff} \quad (25)$$

where n refers to the refractive index of the medium and $n_{202eff}$ and $n_{209eff}$ refers to the effective refractive index of the mode supported by the associated waveguide. The remainder of the laser design and operation remain unchanged from laser 200.

Figure 7:
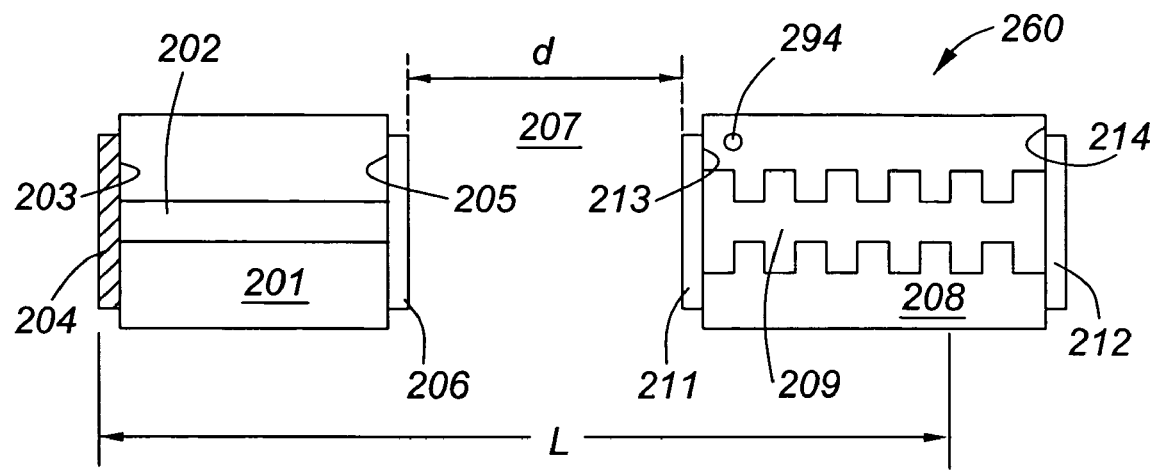
FIG. 7 is a top plan view illustrating a fourth embodiment in the form of an external-cavity laser architecture based on plasmon-polariton gratings with mode matched gain and plasmon-polariton grating chips.

A fourth embodiment, shown in FIG. 7, is an external-cavity laser 260 similar to those described with reference to FIGS. 4, 5 and 6 but which differs because it has no intervening mode conversion element 210, 222 or 242. In the laser 260, the waveguide 202 and the plasmon-polariton grating 209 on chips 201 and 208, respectively, provide sufficient modal overlap for successful coupling in the butt-coupled geometry shown, This can be achieved, for example, by designing the plasmon-polariton grating 209 and/or the waveguide 202 to match their mode sizes. The functioning of the laser 260 is the same as the first three embodiments, a cavity being formed between the mirror 204 and the plasmon-polariton grating 209 through a feedback mechanism provided by both the mirror and the plasmon-polariton grating. The effective optical path length of the cavity for this architecture is given by:

$$L_{eff} = n_{202eff}L_{202} + n_{207}L_{207} + n_{209eff}L_{209eff} \quad (26)$$

where n refers to the refractive index of the medium and $n_{202eff}$ and $n_{209eff}$ refer to the effective refractive index of the mode supported by the associated waveguide.

The architectures of the external cavity lasers described with reference to FIGS. 4, 5, 6 and 7 may be employed, to enable tunable lasers. One such tunable external cavity laser 280 embodying the present invention, based upon the architecture of FIG. 4, will be now described with reference to FIG. 8. The wavelength tunability of the external-cavity laser 280 is achieved by exploiting the materials properties of the plasmon-polariton grating chip 208 and the architecture of the plasmon-polariton grating 209, for example using thermo-optic or electro-optic effects.

The external cavity laser 280 differs from that described with reference to FIG. 4 by the addition of a phase shifting element 282 between the modal transition element 210 and the plasmon-polariton grating 209. Gaps 286 and 288 electrically isolate the phase-shifting element 282 from the mode transition element 210 and the grating 209, respectively. The phase shifting element 282 has electrical contacts 284A and 284B at its opposite ends, respectively, to which a control unit 290 supplies a current and/or voltage to vary the phase shift introduced by the phase shifting element 282.

The control unit 290 will control the current and/or voltage to tune the laser and to ensure that the laser does not "mode hop", i.e., its wavelength jump between peaks 191A, 191B, and so on (see FIG. 3B), as the plasmon-polariton grating 209 is tuned over wavelength. That is, as the reflection spectrum of the plasmon-polariton grating 209 is tuned over wavelength, the phase in the cavity is adjusted such that the cavity mode 191B, in FIG. 3C), remains the resonant mode of the cavity and that the laser does not hop to adjacent mode 191A or 191C allowing them to resonate.

Figure 8:
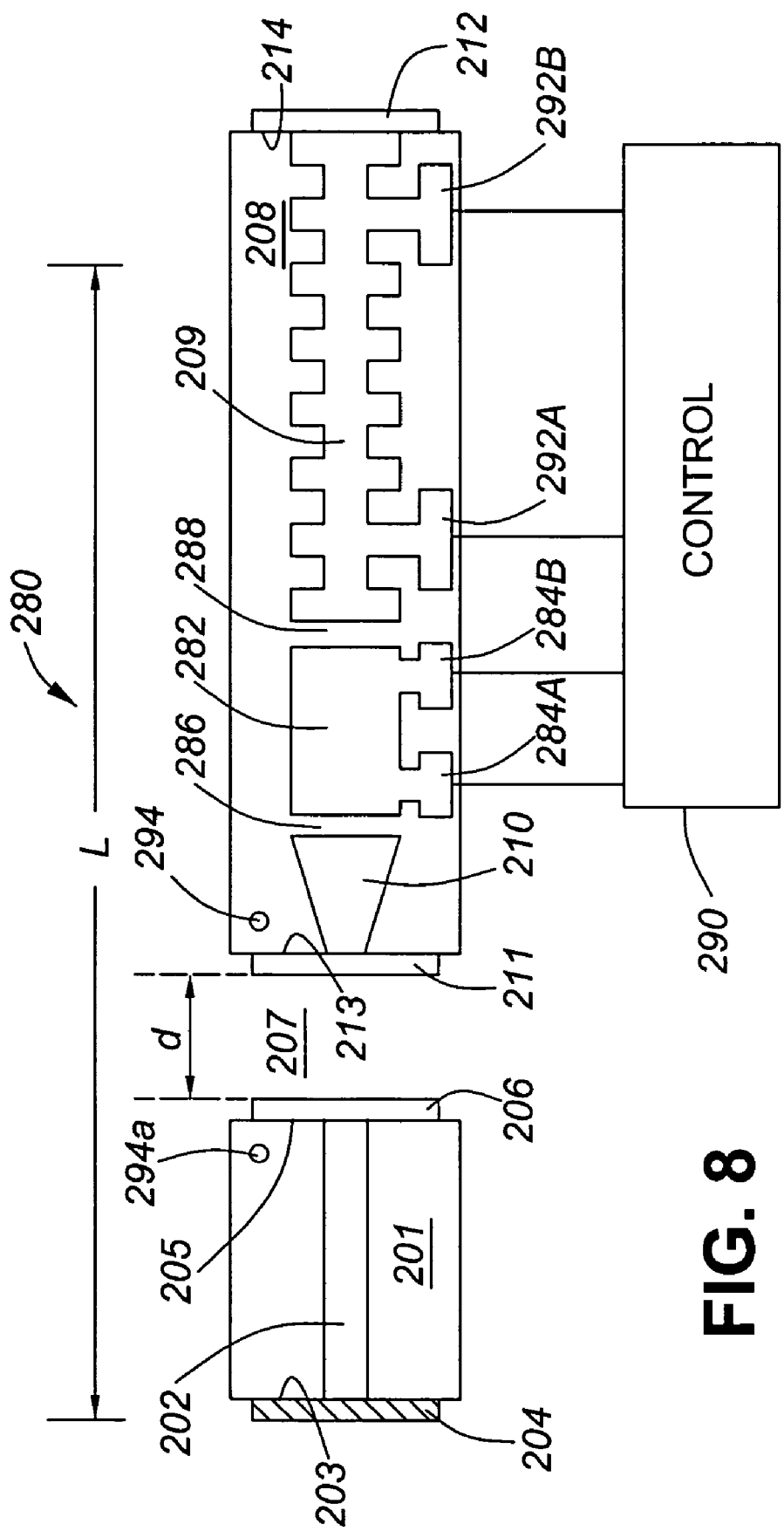
FIG. 8 is a top plan view illustrating a fifth embodiment in the form of a tunable external-cavity laser.

As shown in FIG. 8, the plasmon-polariton grating 209 has electrical contacts 292A and 292B at its opposite ends, respectively, coupled to the control unit 290, allowing the control unit 290 also to vary either the current or voltage, depending upon the material used to implement chip 208, and so tune the grating 209. The effect used to tune the plasmon-polariton grating 209 and the phase shifting element 282 depends on the materials selected for chip 208, as will be discussed in a subsequent section. It should be noted that the tunability of tunable laser embodying this invention can be accomplished in a continuous manner or a discrete manner locked to specific International Telecommunications Union (ITU) wavelengths.

It will be appreciated that the embodiments of FIGS. 5, 6 and 7 could be modified in a similar manner to make them tunable, specifically by adding a phase shifter and means for applying variable current and/or voltage to the phase shifter and the grating.

In these tunable ECLs, the grating and the phase shifter are plasmon-polariton waveguides which can have their propagation characteristics modified by varying the materials properties of the surrounding material(s), as disclosed in several of the above-mentioned disclosures by the present inventor and as will be discussed in a subsequent section.

It should be noted that the use of angled facets on one or both of the chips and/or the use of an angled or bent waveguide in the gain medium can also reduce the reflections at the dielectric discontinuities.

It should also be noted that the emission angle of the light from the gain chip 201 is almost normal to the exiting facet 205 of the gain chip 201. A gain chip can have a larger exiting angle (e.g., ~20°) if a bent waveguide is used. A sharp exiting angle may require the gain chip 201 to be angled with respect to the plasmon-polariton grating chip 208.

It should be noted that, in all of the above-described embodiments of this invention, the mode exiting the chip 201 will suffer some spreading in intervening medium 207. This spreading can be made negligible by ensuring that both chips are in close proximity; i.e. the distance d between chips 201 and 208 is small.

It should be noted that for each of the lasers shown in FIGS. 4 to 8, the chips 201 and 208 can be butt-coupled with an intervening air gap of length d or butt-coupled with an intervening gap filled by a material of refractive index n and length d, or the two chips can be butt-coupled to have a physical contact, in this case d=0.

It should also be noted that the modal overlap between chips 201 and 208 may not be perfect, so some degree of coupling loss may be observed.

Figure 14:
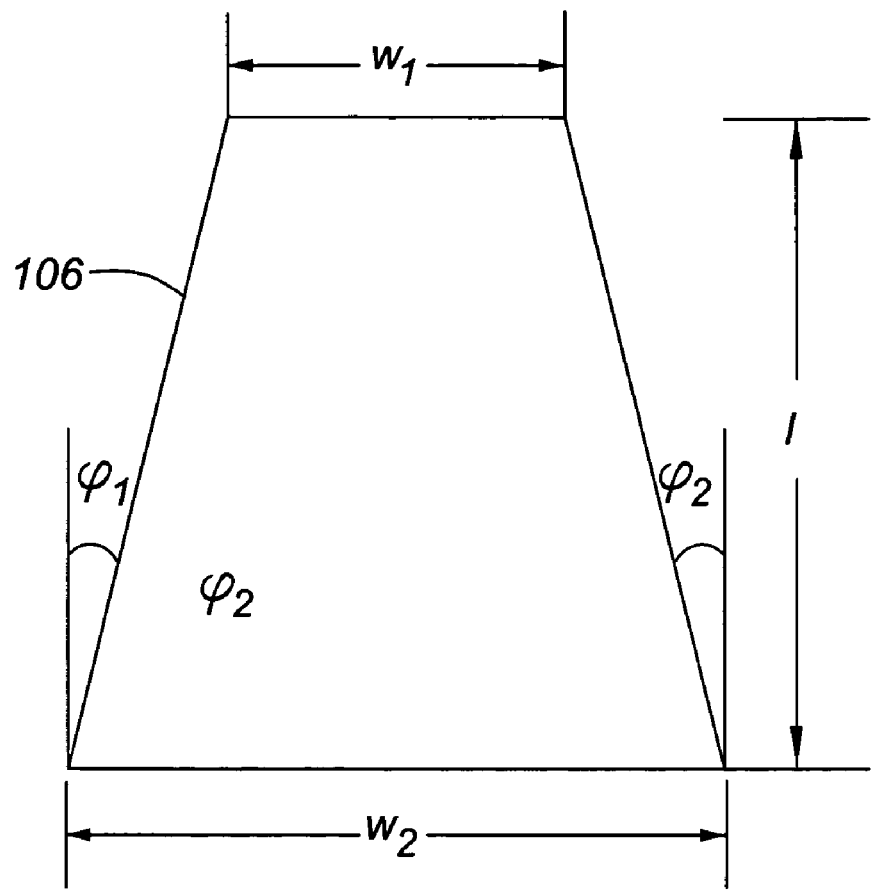
FIG. 14 is a top plan view of tapered plasmon-polariton waveguide section suitable for use as a mode-matching transition element.

FIG. 14 shows a tapered plasmon-polariton waveguide section 106, which can be used as a transition piece to interconnect two waveguides having different mode sizes. The length of the taper is adjusted such that the angles are small, usually in the range of 0.1 to 15 degrees, in order to minimize radiation during the mode shaping. The taper angles at the two sides are not necessarily the same.

Figure 15:
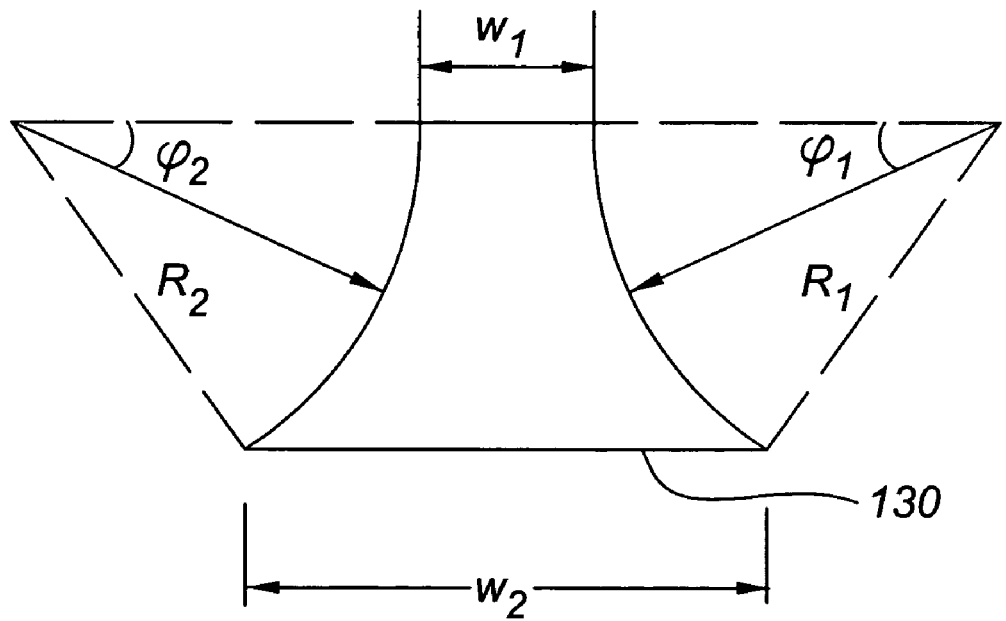
FIG. 15 is a top plan view of an alternative plasmon-polariton waveguide section having curved sides.

FIG. 15 illustrates an alternative transition waveguide section 130 which has curved sides, rather than straight as in the trapezoidal transition section disclosed in FIG. 14 In FIG. 15, the curved sides are shown as sections of circles of radius $R_1$ and $R_2$ subtending angles $\phi_1$ and $\phi_2$ respectively, but it should be appreciated that various functions can be implemented, such as exponential or parabolic. The length of the section is selected in order to minimize radiation during the mode shaping.

It should be appreciated, that the above architectures may be modified to allow for the laser emission to exit facet 203, 214 or both for all of the architectures described.

Figure 13:
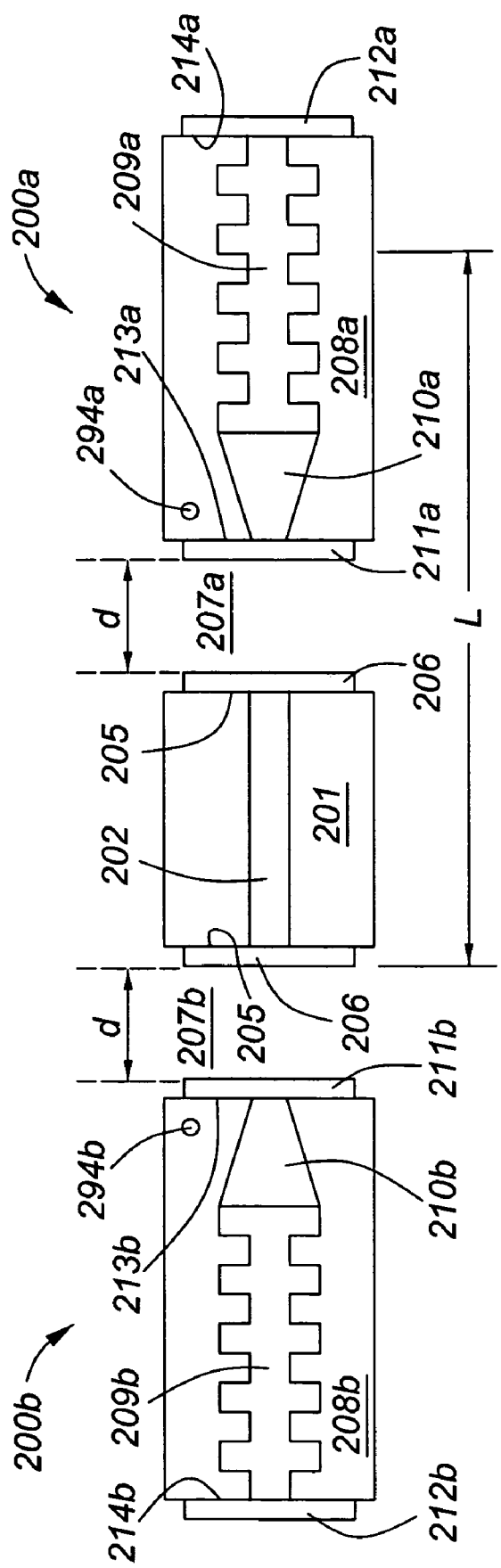
FIG. 13 is a top plan view illustrating an external cavity laser embodying the invention having two gratings.

It should also be noted that the back facet 203 of gain chip 201 does not necessarily have to be coated by a highly reflective mirror coating. The highly reflective coating 204 can be replaced by an integrated Distributed Bragg Reflector (DBR) grating that is integral to the gain medium 202, or by a second plasmon-polariton grating chip similar to chip 208 and coupled to the gain chip 201 by means described herein in relation to the lasers 200, 220, 240, or 260. FIG. 13 illustrates the latter modification, corresponding components having different suffixes as appropriate. In this scenario, the back facet 203 of gain chip 201 would be coated by an optical grade antireflection coating similar to coatings 206 and 211.

It should be noted that a photo-diode can be included for back facet monitoring of the optical output power of the lasers.

It should be noted that the plasmon-polariton gratings used in the above embodiments of the present invention may have any of the forms described in the above-mentioned disclosures by one of the present inventors.

It should be noted that a wavelength locker may be added to any of the above-described lasers to aid in locking the emission wavelength of the laser to a specific wavelength on the ITU grid.

In the above-described embodiments, output light is emitted via distal back facet 214 of grating chip 208 or, in the case of the ECL of FIG. 13, either grating chip 208a and/or 208b, and usually captured by another waveguide, for example a simple-mode optical fibre.

Gain Chip Selection

Selection of gain chip 201 must take account of the following:

1. The mode spot size for coupling to the plasmon-polariton grating chip 208.
2. The spontaneous emission spectrum of the gain chip and its center wavelength will determine the range over which the laser can operate.
3. The gain chip must exhibit gain in at least one state of polarization or both. The current invention can support gain chips that are TE polarized, TM polarized or have equal gain in both the TE and TM states. The gain chip or plasmon-polariton grating chip may need to be rotated or otherwise arranged to align the polarization of the gain chip to the TM polarization of the plasmon-polariton grating i e. if the gain chip is TE polarized only, then one of the chips must be rotated relative to the other. If a gain chip with equal gain in the TE and TM states is used, the alignment is the same as in the case of a TM polarized gain chip, i.e. neither chip needs to be rotated.

4. The length of the gain chip needs to be traded-off against the required gain of the chip and the effective length of the cavity to ensure single mode operation. Also, a gain chip with high gain requires less reflectivity from the mirrors and requires a lower threshold current to produce stimulated emission. A typical gain chip will have a length of 300–600 µm.
5. A front facet with a good quality optical antireflection coating to minimize unwanted reflections in the cavity.
6. The light emission angle of the gain chip should be near normal to the exiting facet, at an angle of 0°–5°.
7. An integral back facet mirror comprises of a high reflection coating stronger than 90%.
8. The choice of gain chip will also impact the maximum optical output power of the laser. The optical output power will depend on the current injected into the gain medium to create stimulated emission, on the available gain of this medium, and on cavity losses.

Plasmon-Polariton Gratings

Figure 9A:
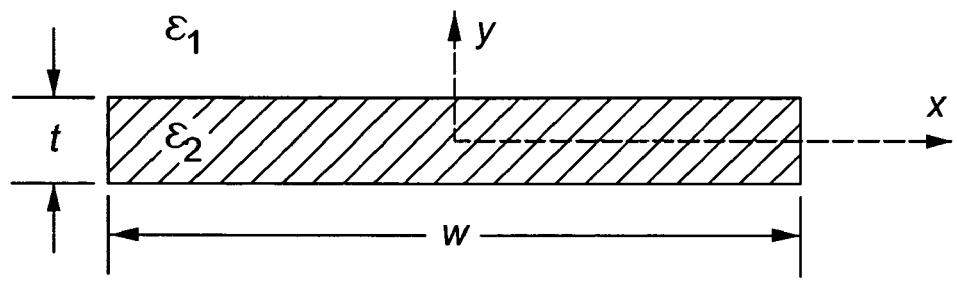
FIG. 9A is a transverse cross-sectional illustration of a symmetric waveguide structure in which the core is comprised of a metal film of thickness t, width w and permittivity $\epsilon_2$ embedded in a cladding or background comprising an "infinite" homogeneous dielectric having a permittivity $\epsilon_1$.
Figure 9B:
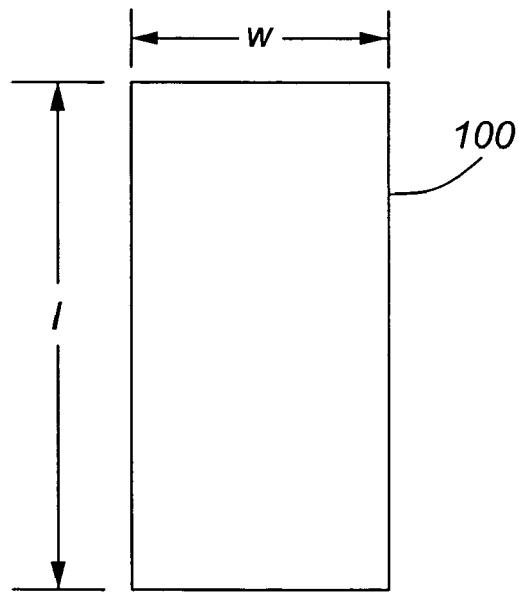
FIG. 9B shows the same structure in plan view.

The plasmon-polariton waveguide structure used in the above-described embodiments of the invention for grating 209, mode converter 210, phase shifter 282 and possibly other elements on chip 208, may be as disclosed in any of U.S. Pat. Nos. 6,442,321 and 6,614,960, U.S. published application No. 2003-0223660 and PCT patent applications Nos. PCT/CA03/00787, and PCT/CA01/01077. As shown in FIG. 9A and FIG. 9B, the waveguide structure comprises a strip 100, e.g., a metal film, of thickness t, width w and equivalent permittivity $\epsilon_2$, surrounded by a cladding or background dielectric of permittivity $\epsilon_1$. The waveguide strip 100 supports a long ranging plasmon-polariton mode, for which the fundamental mode is the $ss_b{}^0$ mode. It has been discovered that, if the width is sufficiently large compared with the thickness, i.e., w/t>>1 with t thin, the $ss_b{}^0$ mode possesses all six field components but the main transverse electric field component is the $E_y$ component. This waveguide geometry thus supports one polarization only and it is perpendicular to the metal in the y-direction (i.e. it is a TM polarizing waveguide).

It should be noted that all of the components on chip 208 preferably are formed from the plasmon-polariton waveguide structure disclosed herein and in the present inventors' earlier disclosures referenced herein. Different components could, of course, have different specific configurations. Of course, the mode transition element 210 could be fabricated as a conventional waveguide, whether it is on chip 201 or 208, If it is on chip 201, the mode transition element 210 preferably is fabricated in a similar manner to waveguide 202.

Figure 10:
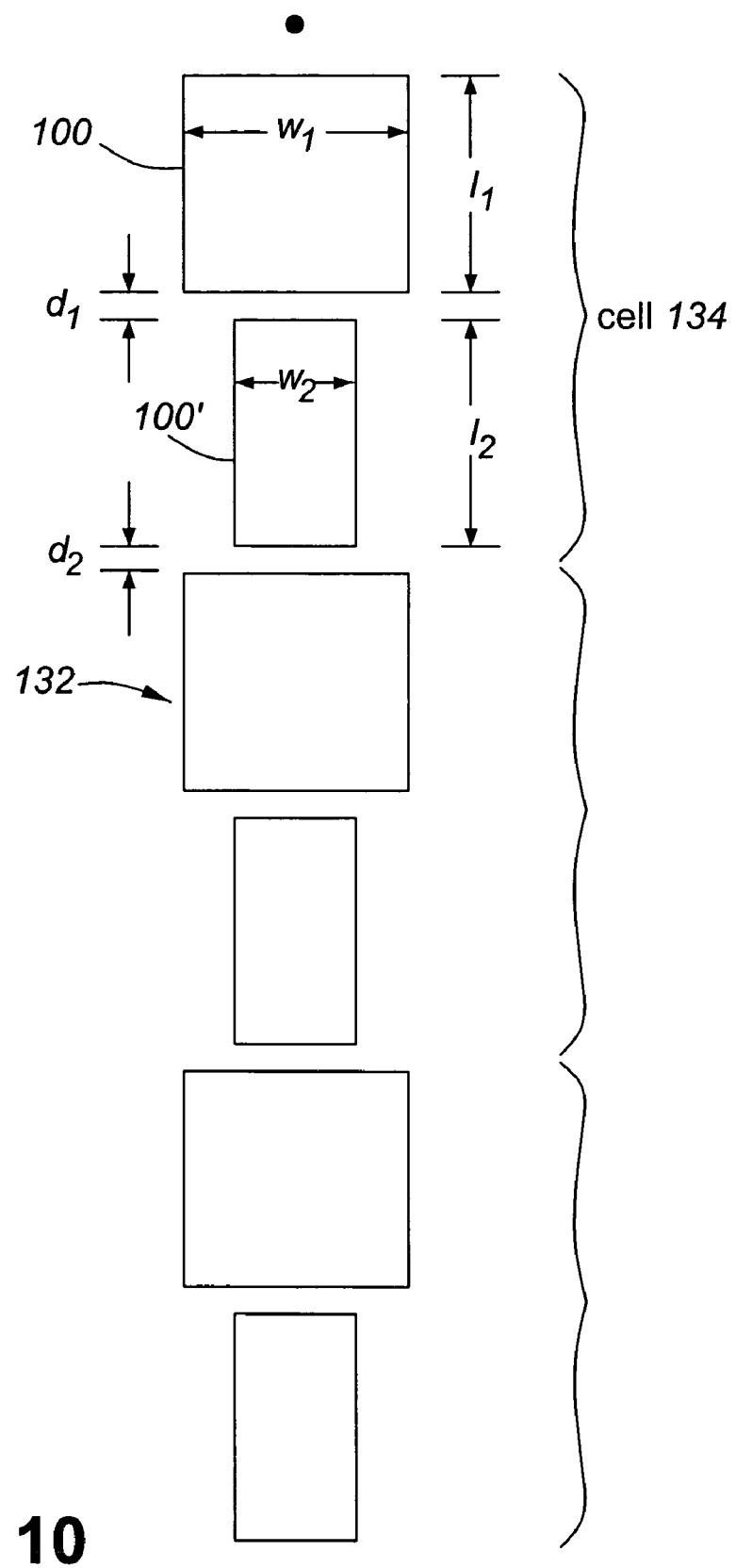
FIG. 10 is a plan view of a plasmon-polariton grating formed by a series of cells each comprising two waveguide sections having different widths and lengths.

FIG. 10 illustrates one example of a grating configuration suitable for filtering optical radiation, comprising a plurality of concatenated grating sections 100 and 100'. Physical characteristics of each section differ from physical characteristics of each adjacent section thereby defining a transition therebetween. At least some of the sections each comprise a waveguide structure formed by a thin strip of material having a relatively high free charge carrier density surrounded by material having a relatively low free charge carrier density. The strip has finite width (w) and thickness (t) with dimensions such that optical radiation having a wavelength in a predetermined range couples to the strip and propagates along the length of the strip as a plasmon-polariton wave, the wave being partially reflected at the transition between such waveguide structure and the following adjacent section. The arrangement is such that reflections at the different said transitions along said grating add constructively.

The strip may comprise for example, a metal or a highly doped semiconductor. The surrounding material may comprise, for example, an insulator or undoped or lightly doped semiconductor.

A plasmon-polariton grating may be constructed by patterning a section of the waveguide strip of FIG. 9A, that is, varying its width w along the direction of propagation to create a physical perturbation in the waveguide over a certain section of length L. Another plasmon-polariton grating design introduces a pattern of narrow metal gaps of appropriate size between metal strips over a certain section of the strip of length L to create the physical perturbation. The 'gaps' may be filled by either the surrounding material, another material, e.g. dielectric, or another strip having a different high free charge carrier density. The pattern may take any form that adheres to the constraints of the applied fabrication method.

Four different material systems are considered within this disclosure, silicon (Si), silica ($SiO_2$), lithium niobate ($LiNbO_3$) and an optical grade polymer. These material systems have been chosen to demonstrate the flexibility of the present invention via various designs. This does not in any way limit the scope of this invention nor the plasmon-polariton gatings described herein or in their co-pending patent applications in any way.

The reader is referred to the above-mentioned international application PCT/CA01/01077 for details of plasmon-polariton gratings. All grating architectures disclosed therein can be used in conjunction with the design of the external-cavity lasers. A uniform plasmon-polariton grating can be used for design simplicity, a sampled plasmon-polariton grating can be used to provide tunability over a wide wavelength spectrum, for example. The geometry of the plasmon-polariton waveguide used to construct the plasmon-polariton grating can be selected to render the plasmon-polariton grating polarizing, i.e., selecting w/t>>1). Wavelength ranges of interest include wavelengths from about 0.5 µm to the far infrared, and especially optical communication wavelengths near 1.31 µm and 1.55 µm. General design considerations for the plasmon-polariton gratings used in the ECL architectures disclosed herein include the following:

1. The length of the plasmon-polariton grating must be set to produce a required power reflectance to sustain stimulated emission, which also depends on the characteristics of the selected gain chip. It should be noted that, when selecting the length of the plasmon-polariton grating, consideration must be given to the minimum required power reflectance, the bandwidth, the materials selected to fabricate the grating and their associated loss, and the total length of the cavity to provide single-mode operation.
2. The bandwidth of the plasmon-polariton grating needs to be controlled to ensure that only one mode of the cavity will resonate. The bandwidth impacts the emitted line width of the laser.
3. The materials are selected to minimize the loss through the plasmon-polariton grating as well as to exploit tunability or stability properties inherent in the selected material.

Mode Conversion and Polarization Alignment

Effective mode matching between the two chips 201, 208 of FIGS. 4 to 8 contributes directly to the overall efficiency of the external-cavity laser. Mode matching is usually achieved using an adiabatic taper. An adiabatic taper is created from a low loss waveguide section that slowly expands or contracts the mode spot size of a mode through a tapering of the size of the waveguide allowing for a better modal overlap between structures of different mode profiles. If the taper is defined on the gain chip, the mode converter may be part of the active gain stripe, but this is not always the case. When the mode matching is achieved using other means, for example lens 242 as in FIG. 6, it is a requirement that the mode conversion element add minimal loss to the cavity.

The plasmon-polariton gratings based on a symmetric waveguide with aspect ratio w/t>>1 are TM polarizing as discussed above. The alignment of the polarization between the gain chip and the grating chip can be handled as follows. In the case of a TM polarized gain chip, a coplanar alignment of the gain chip and the grating chip is easily realized by butt coupling of the chips as described in the embodiments. In the case of a TE polarized gain chip, the gain chip or plasmon-polariton grating chip may need to be rotated or otherwise arranged to align the polarization of the gain chip to the TM polarization of the plasmon-polariton grating.

Alternatively, and as described in U.S. Pat. No. 5,499,256, (Bischel et al.) a coplanar alignment of a TE gain chip to a TM polarizing waveguide is possible if a TE-TM electro-optic mode converter is included on the grating chip to rotate the incident TE polarization from the gain chip to a TM polarization which is then incident on the polarizing waveguide, A TM to TE conversion occurs in the reflected path such that TE polarized light is returned to the gain chip. This type of TE-TM mode conversion can be included at the front of the gating chip 208 when an electro-optically active crystalline material such as lithium niobate or another electro-optic material is used for the grating chip. The design of the electro-optic TE-TM mode converter is well known in the art. Several examples have been disclosed by Alferness et al. in U.S. Pat. Nos. 4,384,760 and 4,533,207 and by Sanford et al. in U.S. Pat. No. 4,776,656. One example described in U.S. Pat. No. 4,390,236 uses a Ti-diffused lithium niobate waveguide with a three electrode structure on a Z-cut Y-propagating lithium niobate crystal. An electric field is applied via the electrode structure to produce a full polarization conversion at a given wavelength. A second voltage can be applied to electrically alter the center frequency of the TE-TM converter rendering the device tunable.

A second TE-TM mode converter described by Huang et al. in "Realization of a Compact and Single-Mode Optical Passive Polarization Converter", IEEE Photonics Technology Letters, vol. 12, no.3, p.317, (2000) makes use of a passive single section of an angled-facet rib waveguide structure to rotate the polarization. The rib height, the facet angle and the base width are selected to maximize the polarization conversion and minimize the coupling loss between sections. A TE-TM mode converter can also be realized using a bent waveguide as disclosed by Obayya et al. in "Beam Propagation Modeling of Polarization Rotation in Deeply Etched Semiconductor Bent Waveguides", IEEE Photonics Technology Letters, vol.13,no7, p.681, (2001). A polarization rotator is realized in a small bend section of a rib waveguide where the waveguide width, bending radius and the slant angle of the waveguide are chosen to achieve a complete polarization rotation in a single section bend. These passive mode converters (angled rib and bend) can be included on the output of the gain chip or at the input of the grating chip of the present invention.

Antireflection Coatings

The antireflection coatings 206, 211 and 212 found in FIGS. 4 to 8 are provided because the reflection at dielectric discontinuities must be minimized to avoid destabilizing the laser cavity. The requirements on the antireflection coatings 206 and 211 depend on the butt-coupling of the chips 201 and 208, i.e. the selection of the spacing d and the intervening medium 207 as discussed above. Using equations (19) to (21), Table 1 summarizes the antireflection coatings required to match a given material to air and to match an InP gain chip, for example, to a plasmon-polariton grating chip where the cladding of the plasmon-polariton grating chip takes on the materials listed. The reflectance at the dielectric discontinuity without the antireflection coating is given for each case.

TABLE 1

Evaluation of Antireflection Coatings

| Material | R no ARC | $n_c$ of ARC to match to air | R no ARC to match InP gain chip to the plasmon-polariton grating chip | $n_c$ of ARC to match InP gain chip to the plasmon-polariton grating chip |
|---|---|---|---|---|
| LiNbO$_3$ | 13% | 1.462 | 4.1% | 2.6 |
| Si | 30% | 1.86 | 0.2% | 3.31 |
| SiO$_2$ | 3% | 1.2 | 14% | 2.13 |
| polymer | 5% | 1.24 | 12% | 2.2 |
| InP | 27% | 1.78 | N/A | N/A |

From the information of Table 1, good quality antireflection coatings are needed for facets 205 and 213 to minimize undesired reflections within the cavity. All of the materials considered above have antireflection coatings to air for telecommunications wavelengths. These coatings are readily obtainable commercially for refractive indexes $n_c$ of 1.46 to 1.90.

The following examples of fixed and tunable lasers are based on the device parameters given below for the external-cavity laser shown in FIG. 5.

1. The properties of the material for the gain chip 201 are given in Table 2. The material is InP based.
2. The assumed total length of the gain chip 201, from facet 203 to 205, is 750 µm. The length of the active waveguide 202 is 600 µm and the adiabatic modal transition 222 is 150 µm in length.
3. The intervening material 207 is air, n=1.0. The length of this region is d=1 µm.
4. The material characteristics for the plasmon-polariton grating chip 208 that will be considered are given in Table 3. As the plasmon-polariton gratings are materials agnostic, a vast selection of materials is possible for this chip. For the purposes of this disclosure, the materials in Table 3 will be considered. This is meant as an example of the possible embodiments of this invention and by no means limits the scope or the spirit of the disclosure. For simplicity, a first order uniform periodic plasmon-polariton grating with 50% duty cycle is considered. The reflectivity is 50% with an optical bandwidth of 0.2 nm. These requirements translate into an approximate length of 500 µm for the plasmon-polariton grating.
5. The total physical length of the laser, from facet 203 to 212 is thus 1251 µm.

TABLE 2

Thermal and Optical Material Properties at 1550 nm for the Gain Chip

| | InP |
|---|---|
| refractive index, n, at 20–25° C. | 3.17 |
| coefficient of thermal expansion (CTE) | $4.6 \times 10^{-6}/°$ C. |
| Temperature variation of refractive index, dn/dT | $2 \times 10^{-4}/°$ C. |

TABLE 3

Material Properties at 1550 nm for the plasmon-polariton gratings

| | LiNbO$_3$ z-cut | Si | SiO$_2$ | Optical Polymer |
|---|---|---|---|---|
| refractive index, n, at 20–25° C. | 2.1377 | 3.4757 | 1.444 | 1.54 |
| coefficient of thermal expansion (CTE) | $7.5 \times 10^{-6}/°$ C. | $2.6 \times 10^{-6}/°$ C. | $0.5 \times 10^{-6}/°$ C. | $50 \times 10^{-6}/°$ C. |
| Temperature variation of refractive index, dn/dT | $35.91 \times 10^{-6}/°$ C. | $1.8 \times 10^{-4}/°$ C. | $10 \times 10^{-6}/°$ C. | $-3 \times 10^{-4}/°$ C. |

Laser Tunability

The laser presented in FIG. 8 can be tuned over narrow (for example, about 2 nm) or wide (for example, about 40 nm) wavelength ranges by exploiting the properties of the material that surround the plasmon-polariton grating, i.e. the cladding.

A. Thermo-optic Effect

Using some of the materials presented in Table 2 and Table 3, we can render the plasmon-polariton gratings tunable with temperature. Heat can be applied to the plasmon-polariton gratings by using external heating elements brought into close proximity to the plasmon-polariton grating e.g. one or more suitably resistive electrodes extending alongside it. The plasmon-polariton grating can also be used as the heating element by applying a current through it via contacts 292A and 292B as shown in FIG. 8 if it is designed as a continuous metal. This eliminates the need for external features and improves the efficiency since a maximum overlap between the temperature contours and the optical mode is achieved, This simplifies the design and thermal management of the plasmon-polariton grating. The phase shifter can be similarly tuned using a current injected through the electrical contacts 284A and 284B. In this situation, small gaps, 286 and 288, are needed between elements 210 and 282 and between elements 282 and 209 respectively of FIG. 8 to isolate the applied current of the plasmon-polariton grating and of the phase shifter. These concepts were disclosed generally in co-pending international application PCT/CA01/01077 which is incorporated herein by reference.

Control unit 290 is used to control the laser. At least one temperature sensor 294 can be used to provide an electrical feedback signal indicative of the temperature of the chip 208. Likewise, at least one temperature server 294A can be used to provide an electrical feedback signal indicative of the temperature of gain chip 201. (Such sensors also could be used in the embodiments of FIGS. 4, 5, 6 and 7).

A thermo-electric cooler (TEC) along with an appropriate control loop can be added is to provide a stable thermal background environment for the device. An external etalon, wavelength locker or other wavelength monitoring element could also be added to help control the wavelength of emission. This element could be positioned beyond the back facet 203, capturing light emitted via back facet 203, or to the side of the grating chip 208 capturing light emitted from taps.

Table 4 contains a summary of the variation of the plasmon-polariton gratings with temperature over a 100° C. range, which represents an external variation. The variation in length of the plasmon-polariton grating δL, the variation in the refractive index of the cladding surrounding the plasmon-polariton grating δn and the variation in the center wavelength of the plasmon-polariton grating $\delta\lambda_B$ are given. The above quantities are found using equations (11), (12), and (15) and (16) respectively. The variation of the laser emission wavelength $\delta\lambda_0$ is approximately given by the variation of the plasmon-polariton grating center wavelength $\delta\lambda_B$. Table 5 contains a summary of the number of tunable channels available for three ITU channel spacings. These values are based on the tuning range given in Table 4.

TABLE 4

Thermo-optic tunability of the plasmon-polariton gratings

| | δL (μm) | δn | $\delta\lambda_B$ (nm) |
|---|---|---|---|
| Si | 0.13 | 0.018 | 8.43 |
| SiO$_2$ | 0.03 | 0.001 | 1.15 |
| Optical Polymer | 2.5 | 0.03 | 37.94 |

TABLE 5

Laser Tunability

| | Number of tunable 50 GHz channels | Number of tunable 100 GHz channels | Number of tunable 200 GHz channels |
|---|---|---|---|
| Si | 21 | 10 | 5 |
| SiO$_2$ | 2 | 1 | 0 |
| Optical Polymer | 94 | 47 | 23 |

From Table 5, the use of an optical polymer or silicon for the plasmon-polariton grating chip 208 provides broad tunability. If a small tuning range is targeted, SiO$_2$ offers the potential of tuning over a few channels. One advantage of a plasmon-polariton grating with a small tuning range and an easily implemented tuning mechanism is the ability to lock a laser to a wavelength on an ITU grid. An InP-SiO$_2$ external-cavity laser can be thermally stabilized using a thermo-optic cooler. The plasmon-polariton grating can then be locked to a wavelength on an ITU grid by passing a current in the plasmon-polariton grating to apply heat locally thus fine tuning the center wavelength.

B. Electro-optic Effect

Wavelength tuning can also be achieved by exploiting the electro-optic effect of certain materials. Lithium niobate for example has an electro-optic effect that can be used to tune the plasmon-polariton gratings over wavelength. A z-cut LiNbO$_3$ crystal can be used to surround the plasmon-polariton grating as an optically infinite cladding. The refractive index of this material along the z-axis is given by:

$$n_2 = n_e - \frac{1}{2}n_e^3 r_{33} E_z, \quad (27)$$

where the change in the refractive index is given by $$\delta n = -\frac{1}{2}n_e^3 r_{33} E_z, \; r_{33}$$

is the electro-optic coefficient $r_{33}$=29.9 pm/V, $E_z$ is the electric field applied along the z-axis and $n_e$ is the refractive index of lithium niobate along the z-axis.

The contacts 284A/284B and/or 292A/292B disposed on chip 208 of FIG. 8 are used, along with at least one other electrode appropriately disposed, to apply an electric field along the z-axis. Suitable electrode configurations are disclosed in one or more of the above-mentioned patents and applications by Berini and include a single electrode extending alongside the grating with the voltage applied between the grating strip(s) and the electrode, and a pair of electrodes extending alongside the grating and spaced apart one on each side of it, with the voltage being applied between the electrodes.

For an applied electric field of ±7V/μm (which is below the poling field of the material of 20V/μm) we obtain a refractive index change of δn=±1.02 e−3. Using equation (17), this corresponds to a total change of δλ$_B$=1.482 nm in the center wavelength of the plasmon-polariton grating. This allows a fast tuning of the plasmon-polariton grating over 3–50 GHz channels. The above does not preclude the use of other crystal cuts for LiNbO$_3$ or the use of other electro-optic materials to tune the plasmon-polariton gratings. The InP—LiNbO$_3$ laser shares the advantage of the InP-SiO$_2$ laser described above in that the simple tuning mechanism can be used to lock the laser to a wavelength on an ITU grid.

Control unit 290 is used to control the laser. At least one temperature sensor 294 can be used to provide an electrical feedback signal indicative of the temperature of the chip. A thermoelectric cooler (TEC) along with an appropriate control loop can be added to provide a stable thermal background environment for the device. An external etalon, wavelength locker or other wavelength monitoring device could also be added to help control the wavelength of emission. This element could be positioned beyond the back facet 203, capturing light emitted via back facet 203, or to the side of grating chip 208 capturing light emitted from taps.

Output Wavelength Stability

Consideration must be given to both the stability of the InP gain chip and the plasmon-polariton gratings. It can be shown that even if a stable plasmon-polariton grating is used, a silica plasmon-polariton grating for example for a 200 GHz WDM source, the operating wavelength λ$_0$ of the laser will still drift significantly due to the temperature effects in the InP gain chip.

Temperature stability is thus required to maintain the wavelength stability of the lasers. A common way of ensuring the stability of a laser source is by the use of a thermo-electric cooler (TEC). The TEC along with a temperature sensor, e.g. a thermistor, shown as element 294 in FIGS. 4 to 8, coupled to a control loop, maintains a constant temperature ensuring a constant emission wavelength. Normally, a TEC is needed for the gain chip and may or may not be required for the plasmon-polariton grating chip.

An external etalon, wavelength locker or other wavelength monitoring device could also be added to help control the wavelength of emission. This element could be positioned beyond the back facet 203, capturing light emitted via back facet 203, or to the side of grating chip 208 capturing light emitted from taps.

A plasmon-polariton grating in silica has a temperature stability of 0.0115 nm/° C., which is comparable to Fiber Bragg Gratings. It will be appreciated by someone skilled in the art, that a composite dielectric of more than one material whose combination and proportion would make the plasmon-polariton grating insensitive to temperature could be used as the clads for a plasmon-polariton grating. One such combination is comprised of silica and polymer since they have dn/dT values of opposite signs. If such a combination is used, in a stratified or laminated construction, the plasmon-polariton grating would be rendered insensitive to temperature fluctuations.

Measurement

An external-cavity laser based on a plasmon-polariton Bragg grating was fabricated in order to demonstrate the invention and comprised the following elements:

1. A packaged TE polarized gain chip with 40 nm W output power centered at 1550 nm. The chip has a polarization maintaining (PM) fiber interconnect that provides the mode matching between the gain medium within the package and the external plasmon-polariton grating chip. A highly reflective coating was applied to the back facet of the device to form one end of the resonant cavity. The packaged gain chip is TE polarized with a measured polarization extinction ratio of 17 dB.

2. A third order plasmon-polariton grating was used to form the other reflector of the resonant external cavity. The plasmon-polariton grating design realized is shown as a scanning electron microscope image in FIG. 11A. The uniform plasmon-polariton grating is composed of alternating sinusoidal waveguide strips of 8μm and 3 μm in width with a 50% duty cycle, a pitch of 1.6 μm, and a length of 5 mm. A molybdenum-gold layer of 18 nm in thickness was used for the waveguide. The waveguide is surrounded by an optically infinite cladding composed of a 15 μm silica under-clad and a thick index-matched polymer upper-clad.

3. The length of the plasmon-polariton grating chip, including input and output access lines was 8.1 mm.

Figure 11A:
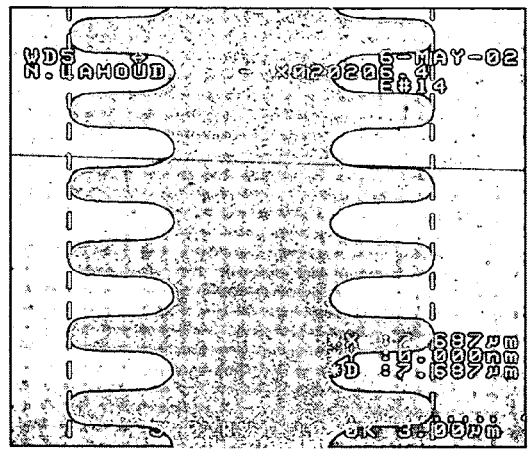
FIG. 11A shows a scanning electron microscope image of a uniform plasmon-polariton grating.
Figure 11B:
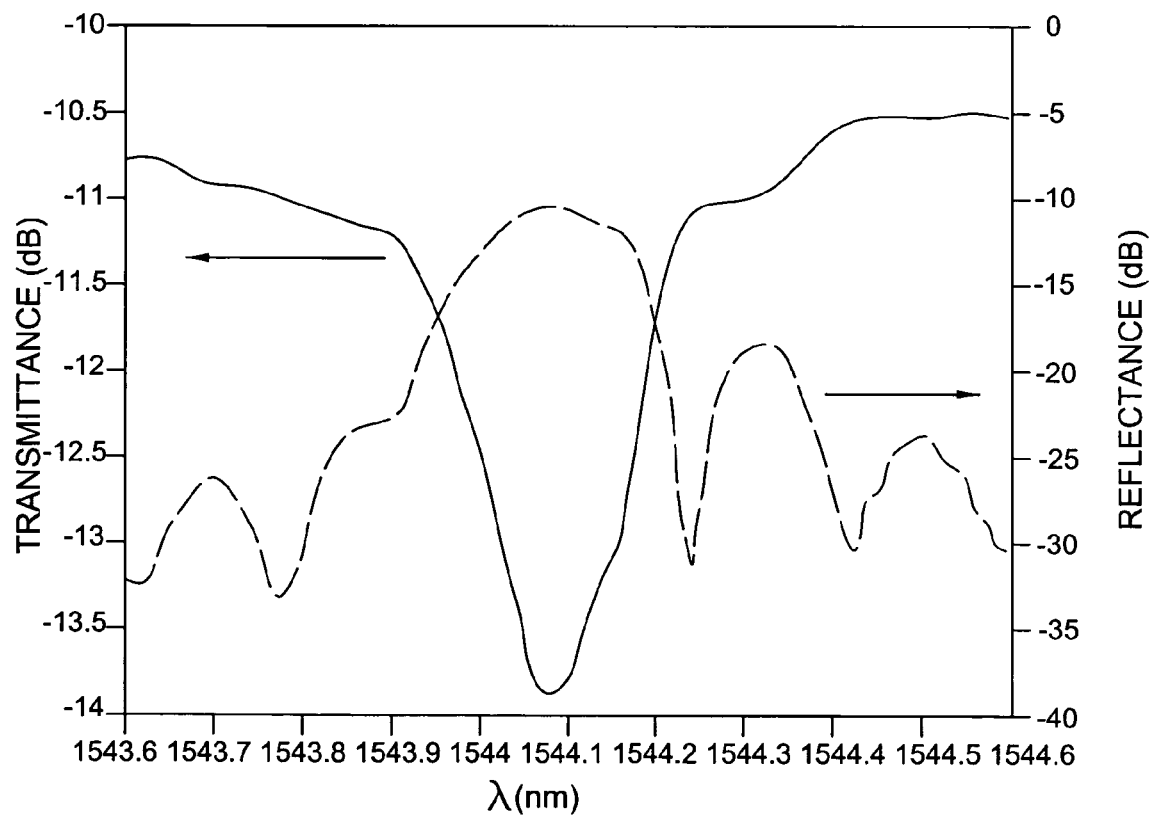
FIG. 11B shows the power reflectance and transmittance of the grating of FIG. 11A.

4. The power reflectance and transmittance of the plasmon-polariton grating are shown in FIG. 11B. The plasmon-polariton grating presents a 10% power reflectivity at 1544.1 nm with a FWHM bandwidth of 0.3 nm.

The gain chip was coupled to the plasmon-polariton grating chip via the PM fiber interconnect and arranged such that a TM polarization was incident on the plasmon-polariton grating. Optical gel was placed between the PM fiber tip and the plasmon-polariton grating chip to reduce coupling losses. The total cavity length was estimated at 20 cm.

Figure 12A:
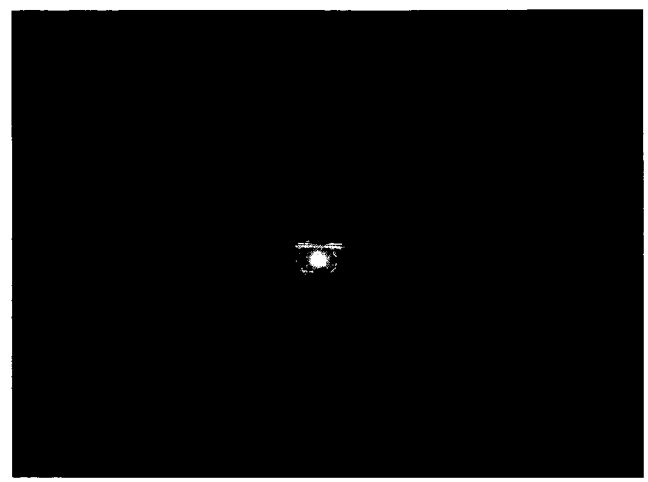
FIGS. 12A, 12B and 12C show the measured performance of an external-cavity laser based on a plasmon-polariton grating.
Figure 12B:
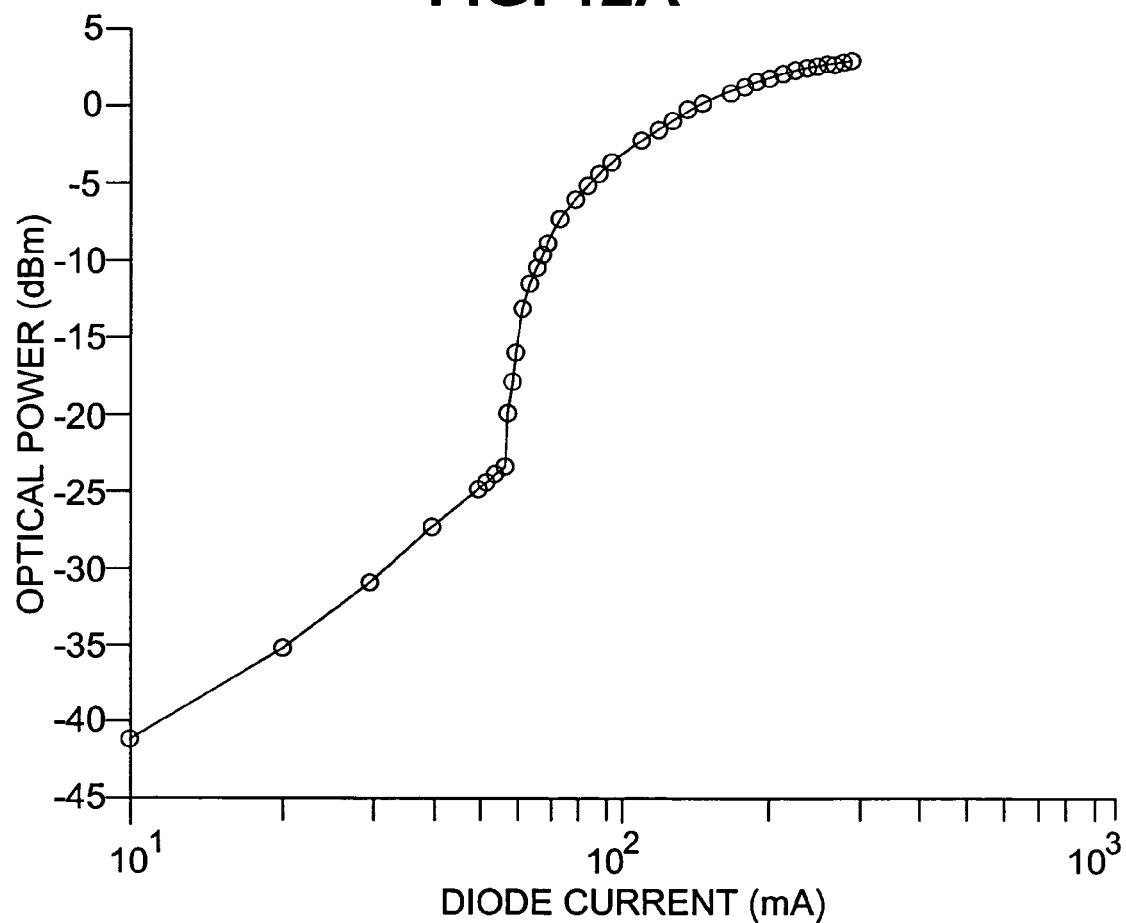
Figure 12C:
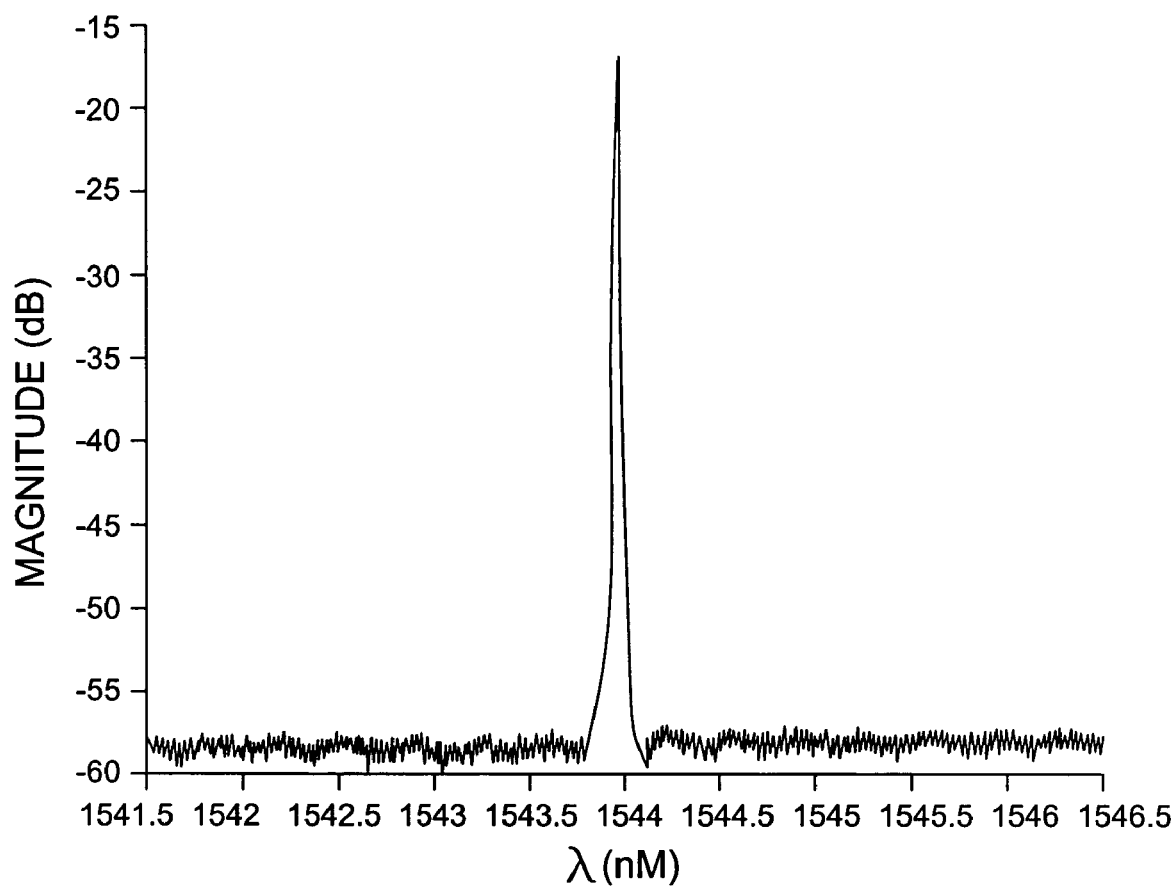

The performance of the laser is shown in FIGS. 12A, 12B and 12C. FIG. 12A shows an infrared image of the laser output. The power versus current relationship for the laser is given in FIG. 12B. Stimulated emission is achieved for a threshold current of 57 mA. The spectral output of the laser is shown in FIG. 12C for an applied current of 60 mA. The laser is multi-moded as the bandwidth of the plasmon-polariton grating greatly exceeds the modal spacing of the cavity due to its long (20 cm) length. This is easily rectified by coupling the chips closely as described with reference to FIGS. 4 to 8.

The polarization extinction ratio of this TM polarized external-cavity laser based upon a plasmon-polariton grating was measured to be around 35 dB.

INDUSTRIAL APPLICABILITY

External cavity lasers of this invention can be designed to exploit the "materials agnostic" character of the plasmon-polariton gratings, for example a gold waveguide core surrounded by a silica cladding or an aluminum waveguide core in a silicon cladding. This key advantage allows the design of plasmon-polariton gratings in a wide variety of material systems exploiting the properties of the materials to achieve desirable performance characteristics for the plasmon-polariton gratings. This enables simple designs for laser tunability, and laser output stability, among other advantages.

Another advantage of using plasmon-polariton gratings lies in their simplified tunability and greater efficiency due to a strong overlap between the tuning effect, electro-optic, thermo-optic or otherwise, and the optical mode over narrow (for example, about 2 nm) and wide (for example, about 40 nm) wavelength ranges. Using an electro-optic material as the clads for example, an electro-optic tuning mechanism can leverage the metal waveguide as an electrode providing a strong overlap between the applied electric field and the optical mode. In this case, only one external electrode would be needed. In a thermo-optic design, a current can be passed through a continuous metal plasmon-polariton grating to generate heat, eliminating the need for external heating elements, and providing a strong overlap between temperature contours and the optical mode. A phase shifting element is also included in the external cavity to ensure a mode hop free tunable operation.

The invention may also be applied advantageously to tunable external cavity lasers with a view to obtaining simplified tunability over narrow (for example, about 2 nm) or wide (for example, about 40 nm) wavelength ranges without mode hopping. Such tunability can be achieved by perturbing the external cavity wavelength selective reflector means, and/or adjusting a phase shifting element included in the external cavity. Perturbing both may provide for a wider turning range without mode-hopping.

External-cavity lasers that embody this invention have several advantages over other laser technologies found in the art. The inclusion of a plasmon-polariton grating within the external-cavity laser design adds many beneficial features. An advantage is a highly linear polarized output and thus an inherently high polarization extinction ratio for the laser. The polarized output results from the polarization sensitivity of the plasmon-polariton grating to the TM state of polarization.

Another advantage is the low cost of fabrication of this external-cavity laser device as the associated plasmon-polariton gratings are printed and implemented by simple fabrication methods.

Another advantage is the reduced size of the external-cavity laser. As most of the embodiments of this invention eliminate the need for bulky free space optics, the size of the overall laser can be greatly reduced.

Wavelength ranges of interest include wavelengths from 0.5 μm to the far infrared, especially at communication wavelengths near 1.31 μm and 1.55 μm.

External cavity lasers embodying the present invention advantageously employ plasmon-polariton gratings for one or both of the mirrors needed to define the cavity to achieve lasing, thereby providing a desirable highly polarized output. It should be noted that the lasers shown in FIGS. 4 to 8 are examples of the possible architectures that may embody this invention and are not in any way limiting the scope of the present invention. It should also be appreciated by someone skilled in the art that several variations to the architectures of FIGS. 4 to 8 are possible within the spirit and scope of this invention.

REFERENCES

1. Berini, P. "Plasmon-polariton waves guided by thin lossy metal films of finite width: Bound modes of symmetric structures". Physical Review B, vol.61, No.15, p.10484, 2000.
2. Charbonneau, R., Berini, P., et al. "Long-Range Plasmon-Polariton Wave Propagation in Thin Metal Films of Finite-Width Excited Using an End-Fire Technique". Proceedings of SPIE, vol.4087, p.534, 2000.
3. Berini, P. "Plasmon-polariton modes guided by a metal film of finite width bounded by different dielectrics", Optics Express, vol.7, no.10, p. 329, 2000.
4. Berini, P. "Plasmon-polariton modes guided by a metal film of finite width". Optics Letters, vol.24, No.15, p.1011, 1999.
5. Charbonneau, R., Berini, P. "Experimental observation of plasmon-polariton waves supported by a thin metal film of finite width", Optics Letters, vol.25, No. 11, p. 844, 2000.
6. Berini, P. "Plasmon-Polariton Waves Guided by Thin Lossy Metal Films of Finite Width: Bound Modes of Asymmetric Structures", Physical Review B, Vol. 63, 125417, 2001.
7. U.S. patent application Publication U.S.2002/0015433 A1.
8. Tredicucci, A. et al. "Single-mode surface-plasmons laser", Applied Physics Letters, vol. 76, no. 16, p. 2164, 2000.
9. Yeh, Pochi. "Optical Waves in Layered Media", Wiley, 1988.
10. Benson, H. et al. "Physique I Mécanique", Editions du Renouveau Pedagogique Inc., 1993.
11. Duarte, F. J. "Tunable Lasers Handbook", Academic Press, 1995.

The invention claimed is:

1. A polarized external-cavity laser comprising:
a cavity formed by a first optical reflector means and a second optical reflector means aligned with said first optical reflector, at least one of the first and second reflector means being only partially reflective to permit light emission therethrough and at least the first optical reflector means being wavelength-selective; and an optical gain medium disposed in the cavity and having an active waveguide formed therein defining part of an optical path between the first and second reflector means;

wherein the wavelength-selective first reflector means comprises a grating comprising a plurality of concatenated grating sections, physical characteristics of each section differing from physical characteristics of each adjacent section thereby defining a transition therebetween, at least some of the sections each comprising a waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave, said wave being partially reflected at the transition between said waveguide structure and the following said adjacent section, the arrangement being such that reflections at the different said transitions along said grating add constructively, and wherein the width (w) of the strip is considerably larger than the thickness (t) of the strip to such an extent that the strip only propagates light having one predetermined substantially linear state of polarization and the grating thus reflects light having said one predetermined substantially linear state of polarization, and wherein interface means between the active waveguide and the wavelength-selective reflector means provides mode-matching and reduction of parasitic reflections from facets of the active waveguide and the wavelength-selective reflector means such that the laser emits substantially linearly polarized light at the wavelength selected by the grating.

2. An external cavity laser according to claim 1, wherein the active waveguide provides gain preferentially for light propagating therethrough in a predetermined plane extending therethrough in the propagation direction, and the grating and active waveguide are interfaced together so that the plane of the grating strip is substantially orthogonal to said predetermined plane.

3. An external cavity laser according to claim 1, wherein the active waveguide provides gain preferentially in two mutually orthogonal planes, and the grating and the active waveguide are interfaced together so that the plane of the grating strip is substantially parallel to one of said mutually orthogonal planes.

4. An external cavity laser according to claim 1, wherein the grating and the active waveguide are interfaced directly together and are each configured so that their modes substantially match, the interface means comprising anti-reflection means at their mutually-opposed facets.

5. An external cavity laser according to claim 2, wherein the grating and the active waveguide are interfaced directly together and are each configured so that their modes substantially match, the interface means comprising anti-reflection means at their mutually-opposed facets.

6. An external cavity laser according to claim 3, wherein the grating and the active waveguide are interfaced directly together and are each configured so that their modes substantially match, the interface means comprising anti-reflection means at their mutually-opposed facets.

7. An external cavity laser according to claim 4, wherein the mutually-opposed facets abut each other and the anti-reflection means comprise an anti-reflection coating on at least one of the facets.

8. An external cavity laser according to claim 5, wherein the mutually-opposed facets abut each other and the anti-reflection means comprise an anti-reflection coating on at least one of the facets.

9. An external cavity laser according to claim 6, wherein the mutually-opposed facets abut each other and the anti-reflection means comprise an anti-reflection coating on at least one of the facets.

10. An external cavity laser according to claim 1, wherein the interface means comprises a mode transition element disposed between the active waveguide and the wavelength selective reflector means.

11. An external cavity laser according to claim 2, wherein the interface means comprises a mode transition element disposed between the active waveguide and the wavelength selective reflector means (209).

12. An external cavity laser according to claim 3, wherein the interface means comprises a mode transition element disposed between the active waveguide and the wavelength selective reflector means.

13. An external cavity laser according to claim 8, wherein the interface means comprises a mode transition element disposed in the optical gain medium between the active waveguide and the wavelength selective reflector means, the mode transition element being a waveguide monolithically integrated with the active waveguide.

14. An external cavity laser according to claim 9, wherein the interface means comprises a mode transition element disposed in the optical gain medium between the active waveguide and the wavelength selective reflector means, the mode transition element being a waveguide monolithically integrated with the active waveguide.

15. An external cavity laser according to claim 10, wherein the interface means comprises a mode transition element disposed in the optical gain medium between the active waveguide and the wavelength selective reflector means, the mode transition element being a waveguide monolithically integrated with the active waveguide.

16. An external cavity laser according to claim 10, wherein the interface means comprises lens means disposed in a space between the active waveguide and the grating.

17. An external cavity laser according to claim 11, wherein the interface means comprises lens means disposed in a space between the active waveguide and the grating.

18. An external cavity laser according to claim 12, wherein the interface means comprises lens means disposed in a space between the active waveguide and the grating.

19. An external cavity laser according to claim 10, wherein the mode transition element comprises a second waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave, the second waveguide structure being coupled optically directly or indirectly to the grating waveguide structure and dimensioned so as to provide the required mode matching.

20. An external cavity laser according to claim 11, wherein the mode transition element comprises a second waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave, the second waveguide structure being coupled optically directly or indirectly to the grating waveguide structure and dimensioned so as to provide the required mode matching.

21. An external cavity laser according to claim 12, wherein the mode transition element comprises a second waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave, the second waveguide structure being coupled optically directly or indirectly to the grating waveguide structure and dimensioned so as to provide the required mode matching.

22. An external cavity laser according to claim 19, wherein the second waveguide structure has a strip that is tapered widthwise, having one end coupled optically to the grating strip and the other end coupled optically to the active waveguide.

23. An external cavity laser according to claim 20, wherein the second waveguide structure has a strip that is tapered widthwise, having one end coupled optically to the grating strip and the other end coupled optically to the active waveguide.

24. An external cavity laser according to claim 21, wherein the second waveguide structure has a strip that is tapered widthwise, having one end coupled optically to the grating strip and the other end coupled optically to the active waveguide.

25. An external cavity laser according to claim 1, further comprising a phase shifting element coupling the one end of the grating waveguide structure directly or indirectly optically to the active waveguide and control means for controlling the phase shifting element and the grating waveguide structure to vary the phase shift introduced by the phase shifting element and the reflection characteristics of the grating waveguide structure, thereby to vary the wavelength of the light emitted by the laser.

26. An external cavity laser according to claim 25, wherein the phase shifting element comprises a waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave.

27. An external cavity laser according to claim 26, further comprising electrode means overlying the strip of the phase shifting element and one or more of the strips of the grating waveguide structure, respectively, and spaced therefrom with a portion of said material therebetween, said portion being electro-optic, the control means comprising means for applying a voltage between the strips and the electrode means to vary characteristics of the portion of material and thereby the phase shift and reflection characteristics.

28. An external cavity laser according to claim 26, further comprising electrode means overlying the strip of the phase shifting element and the strip of the grating waveguide structure, respectively, and comprising electrodes spaced apart on opposite sides of the strips with a portion of said material between each electrode and the adjacent strip, said portion of material being electro-optic, the control means comprising means for applying a voltage between the opposite electrodes to vary characteristics of the portions of material and thereby the phase shift and reflection characteristics.

29. An external cavity laser according to claim 26, further comprising electrode means overlying the strip of the phase shifting element and the strips of the grating waveguide structure, respectively, and spaced therefrom with a portion of said material therebetween, said portion being thermo-optic, the control means comprising means for passing a current through one or more of the strip of the phase shifting element, the strips of the grating, and the electrode means to vary characteristics of one or more of the material surrounding the grating strips, the material surrounding the strip of the phase shifting element, and the portion of material, thereby to vary the phase shift and reflection characteristics.

30. An external cavity laser according to claim 26, further comprising electrode means overlying the strip of the phase shifting element and the strips of the grating waveguide structure, respectively, and comprising electrodes spaced apart on opposite sides of the strips with a portion of said material between each electrode and the adjacent strip, said portion of material being thermo-optic, the control means comprising means for supplying a current through one or more of the strip of the phase shifting element, the strips of the grating, and the electrodes to vary characteristics of one or more of the material surrounding the grating strips, the material surrounding the strip of the phase shifting element, and the portion of material, thereby to vary the phase shift and reflection characteristics.

31. An external cavity laser according to claim 26, wherein at least part of the material adjacent the strips of the phase shifting element and the grating waveguide structure is thermo-optic and the control means is arranged to pass a current through the strips thereby to vary the phase and the reflection characteristics.

32. An external cavity laser according to claim 1, wherein the second reflector means also is a wavelength-selective grating.

33. An external cavity laser according to claim 32, further comprising phase shifting elements each associated with a respective one of the gratings and disposed adjacent one end of the grating that is closest to the active waveguide, and control means for controlling the phase shifting elements synchronously to vary the phase shift introduced thereby and hence the wavelength of the light emitted by the laser.

34. An external cavity laser according to claim 33, wherein each phase shifting element comprises a waveguide structure formed by a thin strip of material having a relatively high free charge carrier density surrounded by material having a relatively low free charge carrier density, the strip having finite width (w) and thickness (t) with dimensions such that optical radiation having a wavelength in a predetermined range couples to the strip and propagates along the length of the strip as a plasmon-polariton wave.

35. An external cavity laser according to claim 34, further comprising electrode means overlying the strip of each phase shifting element and one or more of the strips of each of the grating waveguide structures, respectively, and spaced therefrom with a portion of said material therebetween, each said portion being electro-optic, the control means comprising means for applying a voltage between the strips and the electrode means to vary characteristics of the portion of material and thereby the phase shift and reflection characteristics.

36. An external cavity laser according to claim 34, further comprising electrode means overlying each of the strip of the phase shifting element and one or more of the strips of the grating waveguide structure, respectively, and comprising electrodes spaced apart on opposite sides of the strips with a portion of said material between each electrode and the adjacent strip, each said portion of material being electro-optic, the control means comprising means for applying a voltage between the opposite electrodes to vary characteristics of the portions of material and thereby the phase shift and reflection characteristics.

37. An external cavity laser according to claim 34, wherein at least part of the material adjacent the strips of the phase shifting element and the grating waveguide structure is thermo-optic and the control means is arranged to pass a current through the strips thereby to vary the phase and the reflection characteristics.

38. An external cavity laser according to claim 34, further comprising electrode means overlying the strip of the phase shifting element and at least one of the strips of the grating waveguide structure, respectively, and comprising electrodes spaced apart on opposite sides of the strips with a portion of said material between each electrode and the adjacent strip, said portion of material being electro-optic, the control means comprising means for applying a voltage between the opposite electrodes to vary characteristics of the portions of material and thereby the phase shift and reflection characteristics.

39. An external cavity laser according to claim 34, further comprising electrode means overlying the strip of the phase shifting element and one or more of the strip of the grating waveguide structure, respectively, and spaced therefrom with a portion of said material therebetween, said portion being thermo-optic, the control means comprising means for passing a current through one or more of the strip of the phase shifting element, the strips of the grating, and the electrode means to vary characteristics of one or more of the material surrounding the grating strips, the material surrounding the strip of the phase shifting element, and the portion of material, thereby to vary the phase shift and reflection characteristics.

40. An external cavity laser according to claim 25, further comprising sensor means for sensing the temperature of the wavelength selective means and wherein the control means comprises means for monitoring the sensor means and compensating for temperature changes.

41. An external cavity laser according to claim 25, further comprising sensor means for sensing the temperature of the optical gain medium and wherein the control means comprises means for monitoring the sensor means and compensating for temperature changes.

42. An external cavity laser according to claim 40, further comprising sensor means for sensing the temperature of the optical gain medium and wherein the control means comprises means for monitoring the sensor means and compensating for temperature changes.

43. An external cavity laser according to claim 33, further comprising sensor means for sensing the temperature of each wavelength selective means and wherein the control means comprises means for monitoring the sensor means and compensating for temperature changes.

44. An external cavity laser according to claim 33, further comprising sensor means for sensing the temperature of the optical gain medium and wherein the control means further comprises means for monitoring the sensor means and compensating for temperature changes.

45. An external cavity laser according to claim 43, further comprising sensor means for sensing the temperature of the optical gain medium and wherein the control means further comprises means for monitoring the sensor means and compensating for temperature changes.

46. An external cavity laser according to claim 1, wherein each facet through which light passes carries an antireflection coating.

\* \* \* \* \*